(12) United States Patent
Tanzawa

(10) Patent No.: US 10,153,043 B2
(45) Date of Patent: Dec. 11, 2018

(54) METHODS OF PROGRAMMING AND SENSING IN A MEMORY DEVICE

(71) Applicant: MICRON TECHNOLOGY, INC., Boise, IA (US)

(72) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/021,250

(22) Filed: Jun. 28, 2018

(65) Prior Publication Data
US 2018/0315478 A1 Nov. 1, 2018

Related U.S. Application Data

(62) Division of application No. 15/019,175, filed on Feb. 9, 2016.

(51) Int. Cl.
| | |
|---|---|
| *G11C 11/00* | (2006.01) |
| *G11C 16/04* | (2006.01) |
| *G11C 16/34* | (2006.01) |
| *G11C 16/26* | (2006.01) |
| *G11C 16/10* | (2006.01) |

(52) U.S. Cl.
CPC ......... *G11C 16/0483* (2013.01); *G11C 16/10* (2013.01); *G11C 16/26* (2013.01); *G11C 16/34* (2013.01)

(58) Field of Classification Search
CPC ..... G11C 16/0483; G11C 16/00–16/04; G11C 16/0408; G11C 16/06; G11C 16/08; G11C 16/14–16/16
See application file for complete search history.

(56) References Cited

U.S. PATENT DOCUMENTS

| | | | |
|---|---|---|---|
| 7,551,466 B2 | 6/2009 | Aritome | |
| 8,208,278 B2 | 6/2012 | Goda et al. | |
| 8,559,231 B2 | 10/2013 | Goda et al. | |
| 8,811,084 B2 * | 8/2014 | Tanzawa | G11C 16/0483 365/185.17 |
| 8,873,294 B2 | 10/2014 | Shim et al. | |
| 9,070,470 B1 | 6/2015 | Sakui | |
| 9,208,833 B2 | 12/2015 | Sakui et al. | |
| 9,449,699 B2 | 9/2016 | Nam et al. | |
| 9,697,907 B2 * | 7/2017 | Tanzawa | G11C 16/0483 |
| 9,735,766 B2 * | 8/2017 | Shifren | G11C 13/0069 |
| 9,779,819 B1 * | 10/2017 | Tang | G11C 16/10 |
| 9,934,868 B2 * | 4/2018 | Sakui | G11C 16/26 |
| 2007/0252201 A1 | 11/2007 | Kito et al. | |
| 2012/0120740 A1 | 5/2012 | Shim et al. | |
| 2015/0349126 A1 | 12/2015 | Tanzawa | |

(Continued)

OTHER PUBLICATIONS

"A High-Density NAND EEPROM with Block-Page Programming for Microcomputer Application", Yoshihisa Iwata, et al., IEEE Journal of Solid-State Circuits, vol. 25, No. 2, Apr. 1990 (8 pgs).

(Continued)

*Primary Examiner* — Hien Nguyen

(74) *Attorney, Agent, or Firm* — Dicke, Billig & Czaja, PLLC

(57) ABSTRACT

Methods of programming and sensing in a memory device including connecting first and second data lines in series before programming or sensing, respectively.

21 Claims, 8 Drawing Sheets

(56) References Cited

U.S. PATENT DOCUMENTS

2016/0071842 A1   3/2016  Smith et al.
2018/0225056 A1   8/2018  Roohparvar et al.

OTHER PUBLICATIONS

"A 16 Gb 3-Bit Per Cell (X3) NAND Flash Memory on 56 nm Technology with 8 MB/s Write Rate", Yan Li, et al., IEEE Journal of Solid-State Circuits, vol. 44, No. 1, Jan. 2009 (13 pgs.).

* cited by examiner

METHODS OF PROGRAMMING AND SENSING IN A MEMORY DEVICE

RELATED APPLICATION

This Application is a Divisional of U.S. patent application Ser. No. 15/019,175, titled "MEMORY DEVICES WITH A TRANSISTOR THAT SELECTIVELY CONNECTS A DATA LINE TO ANOTHER DATA LINE AND METHODS FOR PROGRAMMING AND SENSING," filed Feb. 9, 2016, which is commonly assigned and incorporated herein by reference.

FIELD

The present disclosure relates generally to memory devices, and, in particular, the present disclosure relates to memory devices with a transistor that selectively connects a data line to another data line and methods for programming and sensing.

BACKGROUND

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use one-transistor memory cells. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. For example, a row of memory cells might be those memory cells commonly connected to an access line. Columns of the array might include strings (often termed NAND strings) of memory cells connected together in series between a pair of select transistors, e.g., a source select transistor and a drain select transistor. Each source select transistor is connected to a source, while each drain select transistor is connected to a data line, such as bit line. For example, as used herein when elements are connected they are electrically connected, e.g., by means of an electrically conductive path. As used herein, when elements are disconnected, for example, they are electrically disconnected (e.g., electrically isolated) from each other.

A "column" may refer to memory cells that are commonly connected to a data line. It does not require any particular orientation or linear relationship, but instead refers to the logical relationship between memory cell and data line. Note, for example, that for an array having a plurality of memory blocks, a string of memory cells of each memory block might be selectively connected to a common data line through a drain select transistor.

A row of memory cells can, but need not, include all memory cells commonly connected to an access line. A row of memory cells might include every other memory cell commonly connected to an access line. For example, memory cells commonly connected to an access line and selectively connected to even data lines may be a row of memory cells, while memory cells commonly connected to that access line and selectively connected to odd data lines may be another row of memory cells. Other groupings of memory cells commonly connected to an access line may also define a row of memory cells. For certain memory devices, all memory cells commonly connected to a given access line might be deemed a physical row, while those portions of the physical row that are read during a single read operation or programmed during a single program operation (e.g., even or odd memory cells) might be deemed a logical row, sometimes referred to as a page.

Some memory devices might include stacked memory arrays, e.g., often referred to as three-dimensional memory arrays. For example, a stacked memory array might include a plurality of vertical strings (e.g., NAND strings) of memory cells, e.g., connected in series, between a source and a data line. The term vertical may be defined, for example, as a direction that is perpendicular to a base structure, such as a surface of an integrated circuit die. It should be recognized the term vertical takes into account variations from "exactly" vertical due to routine manufacturing and/or assembly variations and that one of ordinary skill in the art would know what is meant by the term vertical.

Memory cells, such as non-volatile memory cells, can be programmed to have a single bit, e.g., during single-level programming, or multiple bits, e.g., during multilevel programming. For example, memory cells programmed to have a single bit may sometimes be referred to as single-level cells (e.g., SLCs), and memory cells programmed to have multiple bits may sometimes be referred to as multilevel cells (e.g., MLCs).

A respective data value (e.g., as represented by a bit pattern) may be assigned to each of a plurality of levels, where each level corresponds to a respective data state. That is, for example, a bit pattern of K bits might be assigned to each of the $2^K$ program levels, where K might be an integer greater than or equal to one (1).

For single-bit-per cell programming, for example, K may be 1, and thus a single bit may be assigned to each of the two program levels, e.g., where each of the two program levels corresponds to a distinct range of threshold voltages (Vts). For example, a single-bit (e.g., two-level) cell might be assigned a bit value of 1 when it is at its lowest program level, corresponding to a range of Vts, e.g. that might be an erased data state, and might be assigned a bit value of zero (0) when it is at its highest program level, corresponding to another range of Vts, e.g., that might be referred to as a programmed data state.

For multi-bit-per-cell programming (e.g., K greater than 1), for example, each level (e.g., data state) may be characterized by a corresponding distinct range of threshold voltages (Vts) of a plurality of distinct ranges of threshold voltages that can be stored on the multilevel memory cells. A margin (e.g., a certain number of volts), such as a dead space, may separate adjacent threshold-voltage ranges, e.g., to facilitate differentiating between data values. This technology permits the storage of two or more bits per memory cell.

A page buffer, for example, might be connected to a data line that is selectively connected to a memory cell, such as a target memory cell targeted for programming during a program operation or sensing, e.g., during a read operation. In some examples, there may be a page buffer for each of the bits assigned to a multi-bit-per-cell memory cell. That is, for example, for a K-bit memory cell there might be N=K page buffers.

Some memory devices, for example, might be configured to program memory cells to have different numbers of bits. For example, a target memory cell might be assigned K bits, e.g., while a memory device is operating in one mode, and the target memory cell might be assigned fewer than K bits, e.g., while operating in another mode. For example, when K bits are assigned to the target memory cell all N=K page buffers may be used, but when fewer than K bits are assigned to the target memory cell fewer than N=K page buffers may be used.

In some examples, memory cells might be used to store two bits per cell (e.g., K=2) when a memory device is operating in a two-bit-per-cell (e.g., a four-level) mode. For example, there might be two page buffers connected to the data line that is selectively connected to the target memory cell, one page buffer for each of the two bits. However, when the memory device is operating in a single-bit-per-cell mode (K=1), the target memory cells might be used to store a single bit, and only one of the two buffers might be used for the single bit, while the other of the two buffers might not be used.

DETAILED DESCRIPTION

Figure 1:
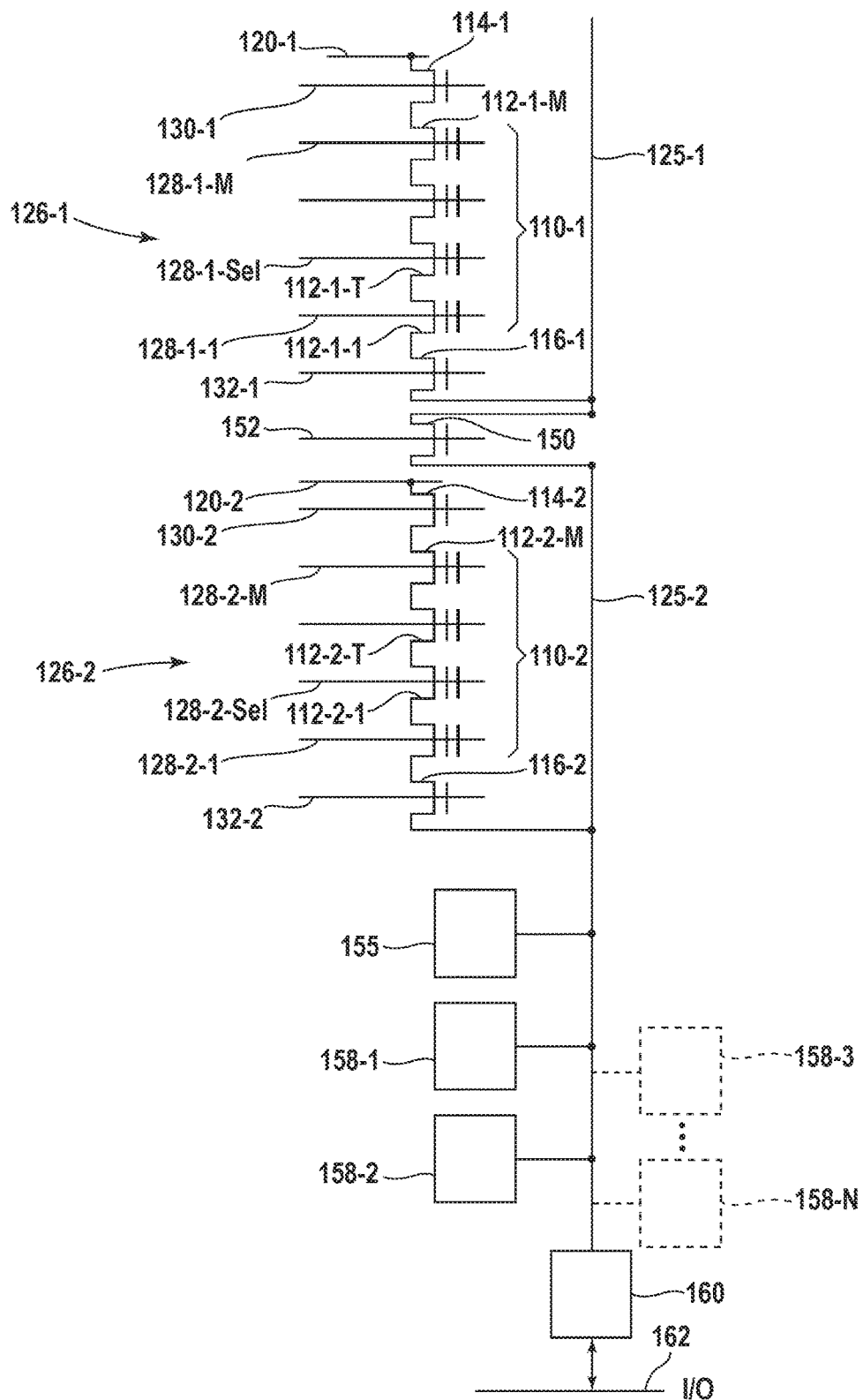
FIG. 1 is a schematic diagram of an example of a portion of a memory array.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 is a schematic diagram of an example of a portion of a memory array. A string 110-1 (e.g., a NAND string) of series-connected memory cells 112-1 (e.g., memory cells 112-1-1 to 112-1-M), such as non-volatile memory cells, may be connected to (e.g., in series with) a select transistor 114-1, such as a source transistor, at one of its ends, and to (e.g., in series with) a select transistor 116-1, such as a drain transistor, at an opposite one of its ends. The memory cells 112-1 in string 110-1 may be a portion of a group of memory cells. For example, memory cells 112-1 in string 110-1 may be a portion of a block 126-1 of memory cells, e.g., that may be erased concurrently. As used herein, multiple acts being performed concurrently will mean that each of these acts is performed for a respective time period, and each of these respective time periods overlaps, in part or in whole, with each of the remaining respective time periods. In other words, those acts are concurrently performed for at least some period of time.

Select transistor 114-1 may be connected to (e.g., in series with) a source 120-1 and may selectively electrically connect string 110-1 to (e.g., in series with) source 120-1. Select transistor 116-1 may be connected to a data line 125-1, such as a bit line, and may selectively electrically connect string 110-1 to (e.g., in series with) data line 125-1. Respective ones of memory cells 112-1-1 to 112-1-M may be respectively connected to respective ones of access lines 128-1-1 to 128-1-M, such as word lines. For example, control gates of the respective ones memory cells 112-1-1 to 112-1-M may be respectively connected to or may respectively form a portion of the respective ones of access lines 128-1-1 to 128-1-M. A control gate of select transistor 114-1 may be connected to a select line 130-1, such as a source select line, and a control gate of select transistor 116-1 may be connected to a select line 132-1, such as a drain select line.

A string 110-2 (e.g., a NAND string) of series-connected memory cells 112-2 (e.g., memory cells 112-2-1 to 112-2-M), such as non-volatile memory cells, may be connected to (e.g., in series with) a select transistor 114-2, such as a source transistor, at one of its ends, and to (e.g., in series with) a select transistor 116-2, such as a drain transistor, at an opposite one of its ends. The memory cells 112-2 in string 110-2 may be a portion of a group of memory cells. For example, memory cells 112-2 in string 110-2 may be a portion of a block 126-2 of memory cells, e.g., that may be erased concurrently.

Select transistor 114-2 may be connected to (e.g., in series with) a source 120-2 and may selectively connect string 110-2 to (e.g., in series with) source 120-2. Select transistor 116-2 may be connected to (e.g., in series with) a data line 125-2, such as a bit line, and may selectively connect string 110-2 to (e.g., in series with) data line 125-2. Respective ones of memory cells 112-2-1 to 112-2-M may be respectively connected to respective ones of access lines 128-2-1 to 128-2-M, such as word lines. For example, control gates of the respective ones memory cells 112-2-1 to 112-2-M may be respectively connected to or may respectively form a portion of the respective ones of access lines 128-2-1 to 128-2-M. A control gate of select transistor 114-2 may be connected to a select line 130-2, such as a source select line, and a control gate of select transistor 116-2 may be connected to a select line 132-2, such as a drain select line.

A transistor 150, such as a pass transistor, may be connected between data lines 125-1 and 125-2. For example, transistor 150 may be connected to (e.g., in series with) data line 125-1 and to (e.g., in series with) data line 125-2 and may selectively electrically connect data line 125-1 to (e.g., in series with) data line 125-2. That is, for example, when transistor 150 is activated, transistor 150 electrically connects data line 125-1 to (e.g., in series with) data line 125-2, and when transistor 150 is deactivated, transistor 150 electrically isolates data line 125-1 from data line 125-2. A control gate of transistor 150 may be connected to a control line 152, for example.

A sense amplifier 155, page buffers 158-1 and 158-2, and a data latch 160 may be connected to (e.g., in series with) data line 125-2, and thus may be selectively connected to (e.g., in series with) data line 125-1 by transistor 150. When string 110-1 and/or string 110-2 are being operated in a multi-bit-per-cell mode of operation, e.g., where the memory cells in string 110-1 and/or string 110-2 are operated as four-level (e.g., two-bit) memory cells and are used to store two bits of data, page buffers 158-1 and 158-2 might be respectively used for respective ones of different bits of the two bits of data of a two-bit memory cell, e.g., of string 110-1 or string 110-2. For example, respective ones of page buffers 158-1 and 158-2 might be respectively used to receive respective ones of the two bits to be programmed to a two-bit memory cell, e.g., of string 110-1 or string 110-2, or to respectively receive respective ones of the two bits that are read from a two-bit memory cell, e.g., of string 110-1 or string 110-2. Data latch 160 may be connected to an input/output (I/O) bus 162.

When strings 110-1 and 110-2 are being operated in a two-level mode (e.g., a single-bit-per-cell mode) of operation, e.g., where the memory cells in strings 110-1 and 110-2 are operated as single-bit memory cells and the memory cells in strings 110-1 and 110-2 are used to store a single bit of data, page buffers 158-1 and 158-2 might be respectively used for data corresponding to a selected memory cell of string 110-1 and a selected memory cell of string 110-2. For example, page buffers 158-1 and 158-2 might be respectively used to receive one bit to be programmed to the selected memory cell of string 110-1 and one bit to be programmed to the selected memory cell of string 110-2 or to receive one bit read from the selected memory cell of string 110-1 and one bit read from selected memory cell of string 110-2.

In other examples, there might be additional page buffers, such as the page buffers 158-3 to 153-N indicated by dashed lines in FIG. 1. For example, page buffers 158-1 to 158-N may be connected to (e.g., in series with) data line 125-2, and thus may be selectively connected to (e.g., in series with) data line 125-1 by transistor 150. Note, for example, that N=2 for the examples discussed above in conjunction with page buffers 158-1 and 158-2.

In some examples, page buffers 158-1 to 158-N might be used when string 110-1 and/or string 110-2 might be operated in an K-bit-per-cell mode of operation or when strings 110-1 and 110-2 are being operated in an m-bit-per-cell mode of operation, where K is less than or equal to N and greater than m. In some examples, K, m, and/or N might be positive integers. Note, for example, that K=N=2 and m=1 for the examples discussed above in conjunction with page buffers 158-1 and 158-2.

For a K-bit-per-cell mode of operation, for example, the memory cells in string 110-1 and/or string 110-2 may be operated as K-bit memory cells and may be used to store K bits of data. In some examples, a K-bit memory cell might be a $2^K$-level memory cell, where the K bits might be stored at one of the $2^K$ levels. For an m-bit-per-cell mode of operation, for example, memory cells in strings 110-1 and 110-2 may operated as m-bit memory cells, and the memory cells in strings 110-1 and 110-2 may be used to store m bits of data. In some examples, an m-bit memory cell might be a $2^m$-level memory cell, where the m bits might be stored at one of the $2^m$ levels.

When string 110-1 and/or string 110-2 are being operated in an K-bit-per-cell (e.g., a $2^K$-level) mode of operation, respective ones of K page buffers (e.g., page buffers 158-1 to 158-K) of page buffers 158-1 to 158-N might be respectively used for respective ones of different bits of the K bits data of a K-bit memory cell, e.g., of string 110-1 or string 110-2. For example, respective ones of the K page buffers of page buffers 158-1 to 158-N might be respectively used to receive respective ones of the K bits to be programmed to a K-bit memory cell, e.g., of string 110-1 or string 110-2, or to receive respective ones of the K bits that are read from a K-bit memory cell, e.g., of string 110-1 or string 110-2.

When strings 110-1 and 110-2 are being operated in an m-bit-per-cell (e.g., a $2^m$-level) mode of operation, respective ones of m page buffers of the page buffers 158-1 to 158-N might be respectively used for respective ones of the m bits data corresponding to a selected memory cell of string 110-1, and respective ones of m other (e.g., m remaining) page buffers of the page buffers 158-1 to 158-N might be respectively used for respective ones of the m bits data corresponding to a selected memory cell of string 110-2. For example, respective ones of m page buffers of the page buffers 158-1 to 158-N might be respectively used to receive respective ones of the m bits to be programmed to the selected memory cell of string 110-1, and respective ones of m other page buffers of the page buffers 158-1 to 158-N might be respectively used to receive respective ones of the m bits to be programmed to the selected memory cell of string 110-2. For example, respective ones of m page buffers of the page buffers 158-1 to 158-N might be respectively used to receive respective ones of m bits read from the selected memory cell of string 110-1, and respective ones of m other page buffers of the page buffers 158-1 to 158-N might be respectively used to receive respective ones of m bits read from the selected memory cell of string 110-2.

Following are some examples for N=4 (four), e.g., for four page buffers 158-1 to 158-4. For example, for N=K=4 (four), string 110-1 and/or string 110-2 may be operated in a four-bit-per-cell (e.g. a $2^4$-level-per-cell) mode of operation, e.g., where the memory cells in string 110-1 and/or string 110-2 are operated as four-bit memory cells and are used to store four bits of data. For K=4 (four), for example, respective ones of page buffers 158-1 to 158-4 may be respectively used for respective ones of different bits of the four bits data of a four-bit memory cell, e.g., of string 110-1 or string 110-2. For example, respective ones of page buffers 158-1 to 158-4 might be respectively used to receive respective ones of the four bits to be programmed to a four-bit memory cell, e.g., of string 110-1 or string 110-2, or to receive respective ones of the four bits that are read from a four-bit memory cell, e.g., of string 110-1 or string 110-2.

For N=4 (four) and K=3 (three), for example, string 110-1 and/or string 110-2 may be operated in a three-bit-per-cell (e.g. a $2^3$-level-per-cell) mode of operation, e.g., where the memory cells in string 110-1 and/or string 110-2 are operated as three-bit memory cells and are used to store three bits of data. For K=3 (three), for example, respective ones of three page buffers (e.g., page buffers 158-1 to 158-3) of page buffers 158-1 to 158-4 may be respectively used for respective ones of different bits of the three bits data of a three-bit memory cell, e.g., of string 110-1 or string 110-2. For example, respective ones of three page buffers (e.g., page buffers 158-1 to 158-3) of page buffers 158-1 to 158-4 might be respectively used to receive respective ones of the three bits to be programmed to a three-bit memory cell, e.g., of string 110-1 or string 110-2, or to receive respective ones of the three bits that are read from a three-bit memory cell, e.g., of string 110-1 or string 110-2.

For an example where N=4 (four) and K=3 (three) or 4 (four), m might be 2 (two), for example. For example, respective ones of two page buffers (e.g., page buffers 158-1 and 158-3) of the page buffers 158-1 to 158-4 might be respectively used for respective ones of the two bits of data corresponding to a selected memory cell of string 110-1, and respective ones of two other (e.g., two remaining) page buffers (e.g., page buffers 158-2 and 158-4) of the page buffers 158-1 to 158-4 might be respectively used for respective ones of the two bits of data corresponding to a selected memory cell of string 110-2. For example, respective ones of two page buffers (e.g., page buffers 158-1 and 158-3) of the page buffers 158-1 to 158-4 might be respectively used to receive respective ones of the two bits to be programmed to the selected memory cell of string 110-1, and respective ones of two other page buffers (e.g., page buffers 158-2 and 158-4) of the page buffers 158-1 to 158-4 might be respectively used to receive respective ones of the two bits to be programmed to the selected memory cell of string 110-2. For example, respective ones of two page buffers (e.g., page buffers 158-1 and 158-3) of the page buffers 158-1 to 158-4 might be respectively used to receive respective ones of two bits read from the selected memory cell of string 110-1, and respective ones of two other page buffers (e.g., page buffers 158-2 and 158-4) of the page buffers 158-1 to 158-4 might be respectively used to receive respective ones of two bits read from the selected memory cell of string 110-2.

For an example where N=4 (four) and K=3 (three) or 4 (four), m might be 1 (one), for example. For example, one page buffer (e.g., page buffer 158-1) of the page buffers 158-1 to 158-4 might be used for one bit of data corresponding to a selected memory cell of string 110-1, and one page buffer (e.g., page buffer 158-2) of the page buffers 158-1 to 158-4 might be used for one bit of data corresponding to a selected memory cell of string 110-2. For example, one page buffer (e.g., page buffer 158-1) of the page buffers 158-1 to 158-4 might be used to receive one bit of data to be programmed to the selected memory cell of string 110-1, and one page buffer (e.g., page buffer 158-2) of the page buffers 158-1 to 158-4 might be used to receive one bit of data to be programmed to the selected memory cell of string 110-2. For example, one page buffer (e.g., page buffer 158-1) of the page buffers 158-1 to 158-4 might be used to receive one bit of data read from the selected memory cell of string 110-1, and one page buffer (e.g., page buffer 158-2) of the page buffers 158-1 to 158-4 might be used to receive one bit of data read from the selected memory cell of string 110-2.

Figure 2:
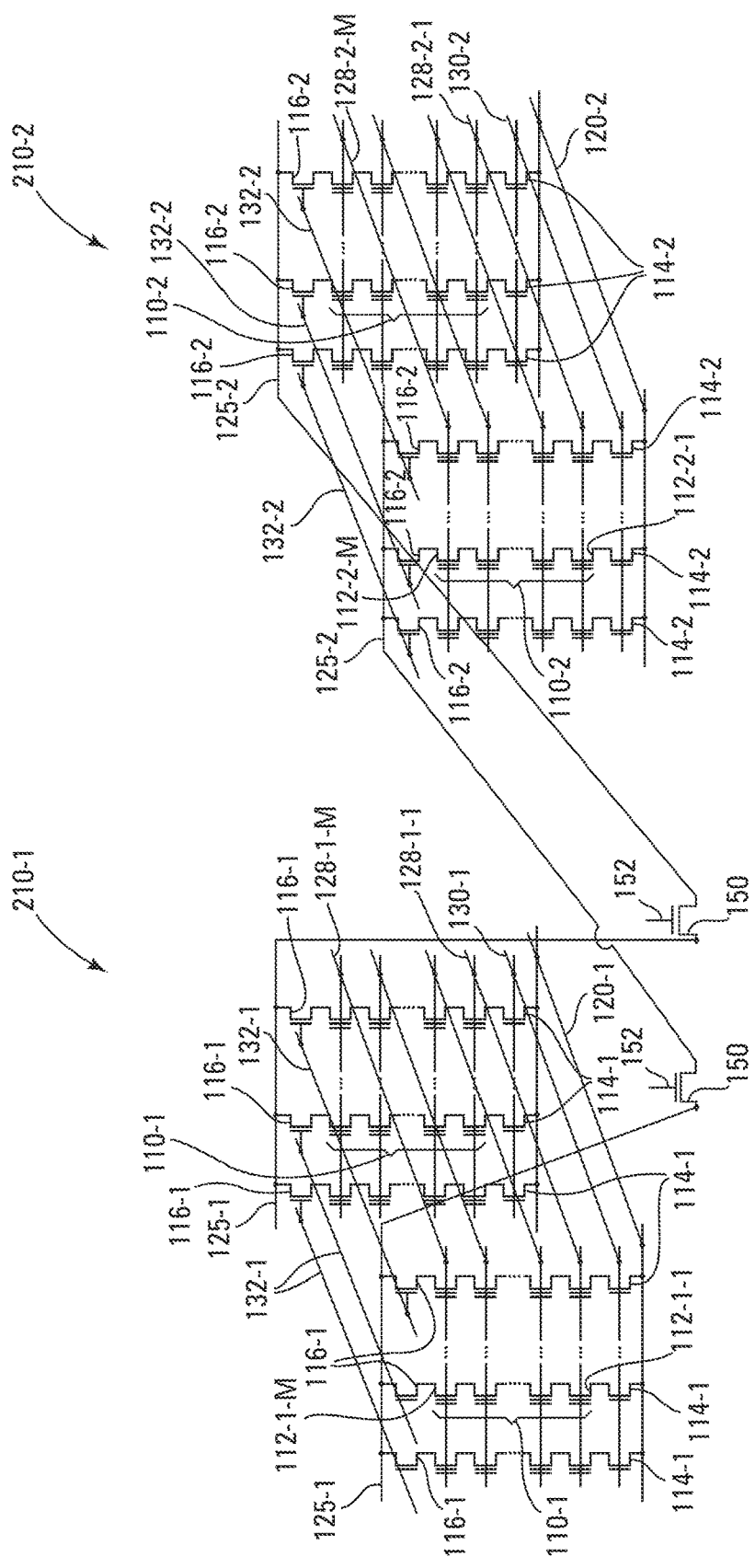
FIG. 2 is a schematic diagram of another example of a portion of a memory array.
Figure 3:
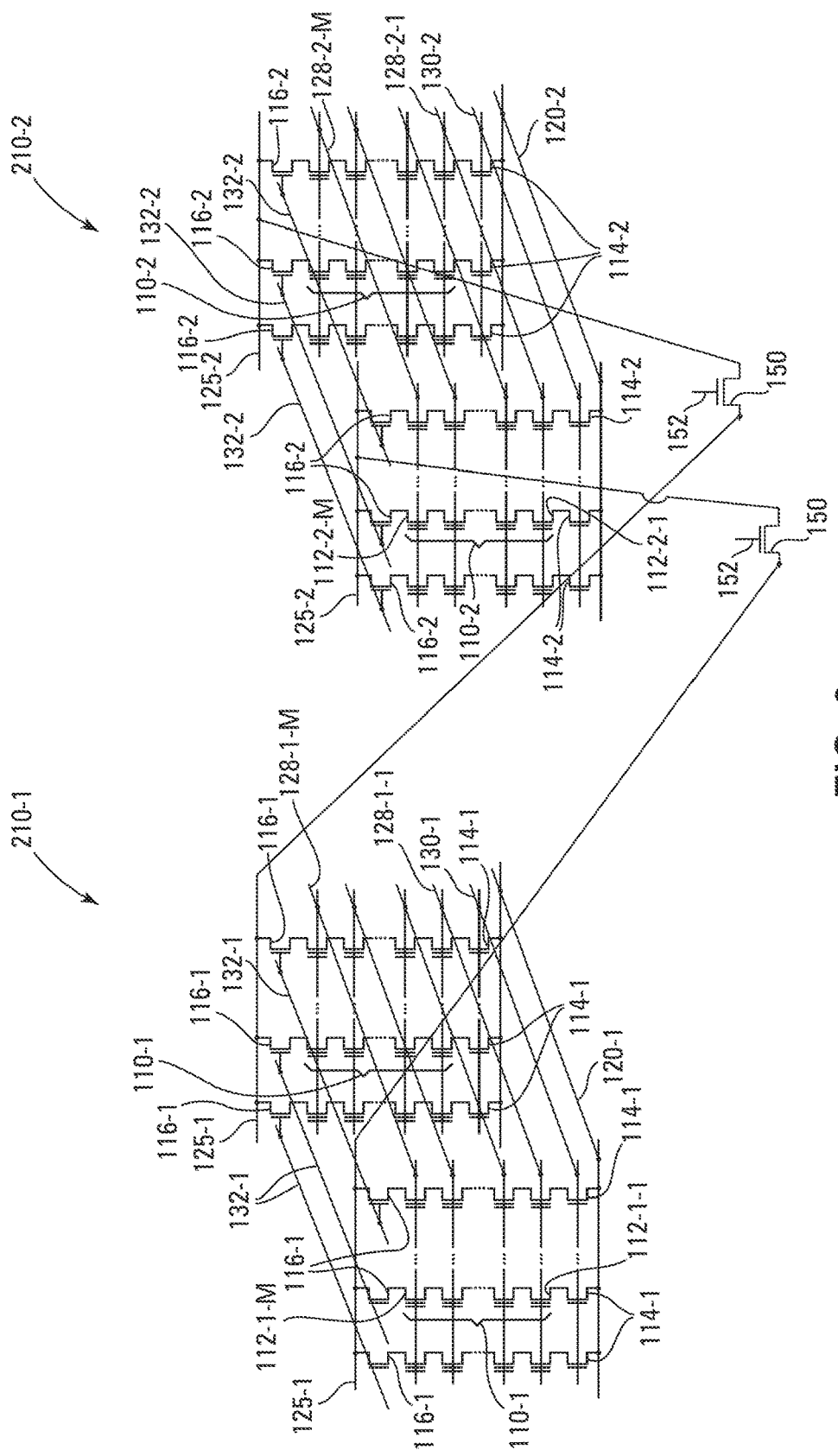
FIG. 3 is a schematic diagram of another example of a portion of a memory array.

A portion 210-1 of the stacked, e.g., the three-dimensional, memory arrays, in the examples of FIGS. 2 and 3 may include one or more of the blocks 126-1. For example, portion 210-1 may include a plurality of data lines 125-1. A plurality of select transistors 116-1 may be connected to each of the plurality of data lines 125-1. Respective ones of a plurality of strings 110-1 of memory cells 112-1 may be respectively connected to respective ones of the plurality of select transistors 116-1 connected to each of the plurality of data lines 125-1. For example, each of the strings 110-1 in the examples of FIGS. 2 and 3 might be a vertical string with a vertical stack of memory cells 112-1.

Respective ones of a plurality of select transistors 114-1 may be respectively connected to the respective ones of the plurality of the strings 110-1 that may be respectively connected to the respective ones of the plurality of select transistors 116-1 connected to each of the plurality of data lines 125-1. Each of the plurality of the select transistors 114-1 may be commonly connected to the common source 120-1 and may be commonly connected to the common select line 130-1.

Respective ones of the memory cells 112-1-1 to 112-1-M in each of the plurality of the strings 110-1 may be respectively connected to respective ones of common access lines 128-1-1 to 128-1-M. One select transistor 116-1 of the plurality of the select transistors 116-1 connected to each of the plurality of data lines 125-1 is connected to a respective one of a plurality of select lines 132-1.

A portion 210-2 of the memory arrays shown in the examples of FIGS. 2 and 3 may include one or more of the blocks 126-2. For example, portion 210-2 may include a plurality of data lines 125-2. A plurality of select transistors 116-2 may be connected to each of the plurality of data lines 125-2. Respective ones of a plurality of the strings 110-2 of memory cells 112-2 may be respectively connected to respective ones of the plurality of select transistors 116-2 connected to each of the plurality of data lines 125-2. For example, each of the strings 110-2 in the examples of FIGS. 2 and 3 might be a vertical string with a vertical stack of memory cells 112-2.

Respective ones of a plurality of the select transistors 114-2 may be respectively connected to the respective ones of the plurality of the strings 110-2 that may be respectively connected to the respective ones of the plurality of select transistors 116-2 connected to each of the plurality of data lines 125-2. Each of the plurality of the select transistors 114-2 may be commonly connected to the common source 120-2 and may be commonly connected to the common select line 130-2.

Respective ones of the memory cells 112-2-1 to 112-2-M in each of the plurality of the strings 110-2 may be respectively connected to respective ones of common access lines 128-2-1 to 128-2-M. One select transistor 116-2 of the plurality of the select transistors 116-2 connected to each of the plurality of data lines 125-1 is connected to a respective one of a plurality of select lines 132-2.

Respective ones of the plurality of data lines 125-1 may be respectively connected to respective ones of a plurality of transistors 150 that may be respectively connected to respective ones of the plurality of data lines 125-2, as shown in the examples of FIGS. 2 and 3. For example, the respective ones of the plurality of transistors 150 may respectively selectively connect the respective ones of the plurality of data lines 125-1 to the respective ones of the plurality of data lines 125-2. Each of the plurality of transistors 150 may be connected to a control line 152.

In the example of FIG. 2, the plurality of transistors 150 may be between the portions 210-1 and 210-2 and may be at a vertical level that is below the portions 210-1 and 210-2. For example, in FIG. 2, the respective ones of the plurality of transistors 150 may be respectively between the respective ones of the plurality of data lines 125-1 and the respective ones of the plurality of data lines 125-2 and may be respectively connected to ends of the respective ones of the plurality of data lines 125-1 and the respective ones of the plurality of data lines 125-2.

In the example of FIG. 3, the plurality of transistors 150 may be under (e.g., directly vertically under) portion 210-2, e.g., at a vertical level that is directly vertically below portion 210-2. For example, in FIG. 3, the respective ones of the plurality of transistors 150 may be respectively connected to ends of the respective ones of the plurality of data lines 125-1. The respective ones of the plurality of transistors 150 may be respectively connected to the respective ones of the plurality of data lines 125-2 somewhere between the ends of the respective ones of the plurality of data lines 125-2. For example, a transistor 150 may be connected to a respective data line 125-2 between where adjacent strings 110-2 of portion 210-2 are selectively connected to the respective data line 125-2. For example, the adjacent strings may be respectively in different blocks of memory cells in portion 210-2 such that the transistor 150 may be connected to the respective data line 125-2 somewhere between the different blocks of memory cells in portion 210-2.

Figure 4:
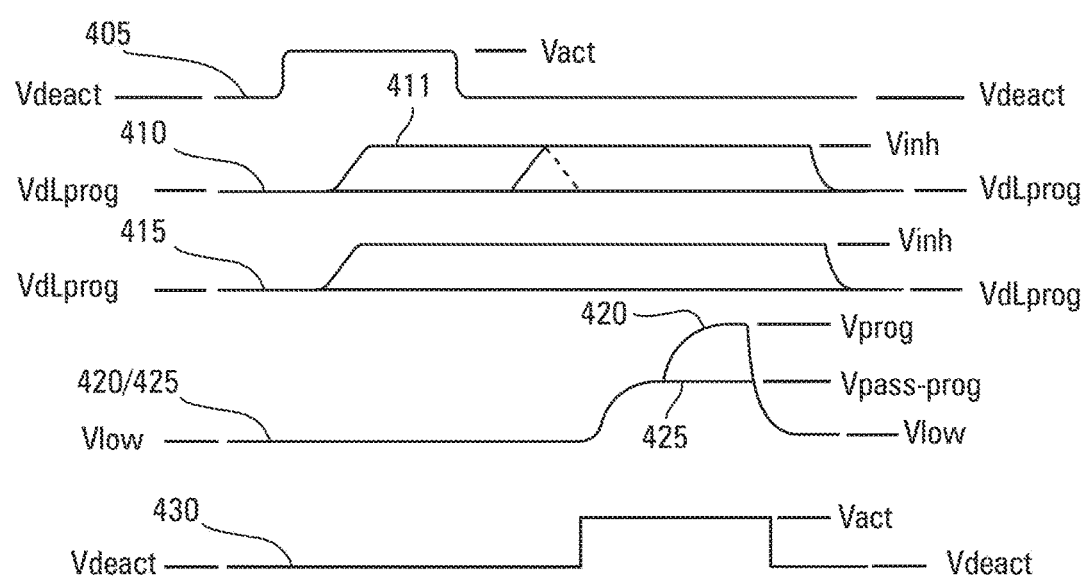
FIG. 4 presents a timing diagram for an example of a programming operation.

FIG. 4 presents a timing diagram for an example of a programming operation, e.g., for programming the configuration of FIG. 1. For example, the programming operation in the example of FIG. 4 might be applied during a single-bit-per-cell (e.g., a two-level) programming mode for programming a target memory cell 112-1-T of the memory cells 112-1-1 to 112-1-M in the string 110-1 in FIG. 1 that is targeted for programming, e.g., as a single-bit memory cell, and a target memory cell 112-2-T of the memory cells 112-2-1 to 112-2-M in the string 110-2 in FIG. 1 that is targeted for programming, e.g., as a single-bit memory cell. The remaining memory cells of the memory cells 112-1-1 to 112-1-M in the string 110-1 are untargeted memory cells of the memory cells 112-1-1 to 112-1-M in the string 110-1 and are not targeted for programming, and the remaining memory cells of the memory cells 112-2-1 to 112-2-M in the string 110-2 are untargeted memory cells of the memory cells 112-2-1 to 112-2-M in the string 110-2 and are not targeted for programming. Note that the programming operation in the example of FIG. 4 might be applied during an m-bit-per-cell (e.g., a $2^m$-level) programming mode for programming the target memory cell 112-1-T, e.g., as an m-bit memory cell, and the target memory cell 112-2-T, e.g., as an m-bit memory cell. Note that m=1 for the single-bit-per-cell programming mode.

The control gate of the target memory cell 112-1-T is connected to a selected access line 128-1-Sel of the access lines 128-1-1 to 128-1-M, and the control gate of the target memory cell 112-2-T is connected to a selected access line 128-2-Sel of the access lines 128-2-1 to 128-2-M. The remaining access lines of the access lines 128-1-1 to 128-1-M are unselected access lines of the access lines 128-1-1 to 128-1-M and are respectively connected to the control gates of the untargeted memory cells of the memory cells 112-1-1 to 112-1-M in the string 110-1, and the remaining access lines of the access lines 128-2-1 to 128-2-M are unselected access lines of the access lines 128-2-1 to 128-2-M and are respectively connected to the control gates of the untargeted memory cells of the memory cells 112-2-1 to 112-2-M in the string 110-2.

A voltage 405 may be applied to the control line 152 that is connected to the control gate of transistor 150. Voltages 410 and 415 may be respectively applied to data lines 125-2 and 125-1. For example, for single-bit-per-cell programming, page buffer 158-1 might supply voltage 415 to data line 125-1, e.g., in response to an address being received that addresses target memory cell 112-1-T, and page buffer 158-2 might supply voltage 410 to data line 125-2, e.g., in response to an address being received that addresses target memory cell 112-2-T. In other examples, for m-bit-per-cell programming, one of m page buffers (e.g., page buffer 158-1) of page buffers 158-1 to 158-N assigned to target memory cell 112-1-T might supply voltage 415 to data line 125-1 and one of m other page buffers (e.g., page buffer 158-2) of page buffers 158-1 to 158-N assigned to target memory cell 112-2-T might supply voltage 410 to data line 125-2.

A voltage 420 may be concurrently applied to the selected access lines 128-1-Sel and 128-2-Sel, and thus to the control gates of the target memory cells 112-1-T and 112-2-T respectively connected to the selected access lines 128-1-Sel and 128-2-Sel. A voltage 425 may be concurrently applied to the unselected access lines of the access lines 128-1-1 to 128-1-M, and thus to the control gates of the untargeted memory cells of the memory cells 112-1-1 to 112-1-M respectively connected to the unselected access lines of the access lines 128-1-1 to 128-1-M, and to the unselected access lines of the access lines 128-2-1 to 128-2-M, and thus to the control gates of the untargeted memory cells of the memory cells 112-2-1 to 112-2-M respectively connected to the unselected access lines of the access lines 128-2-1 to 128-2-M. A voltage 430 may be concurrently applied to the select lines 132-1 and 132-2 respectively connected to the control gates of select transistors 116-1 and 116-2.

The programming operation might commence by loading data (e.g., one bit of data for single-bit-per-cell programming) into page buffer 158-1 that is to be programmed into target memory cell 112-1-T and data (e.g., one bit of data for single-bit-per-cell programming) into page buffer 158-2 that is to be programmed into target memory cell 112-2-T. For example, data latch 160 may receive the data from I/O bus 162 and respectively latch the data into page buffers 158-1 and 158-2. Transistor 150 may then be activated from a deactivated state by changing the voltage level of the voltage 405 applied to control line 152 from a deactivation voltage level Vdeact, such as a voltage level Vss (e.g., ground), that causes transistor 150 to be deactivated to an activation voltage level Vact, such as a voltage level Vcc or greater, that activates transistor 150. Note, for example, that for m-bit per cell programming, the programming operation might commence by loading respective ones of the m bits of data to be programmed into target memory cell 112-1-T into respective ones of the m page buffers assigned to target memory cell 112-1-T and by loading respective ones of the m bits of data to be programmed into target memory cell 112-2-T into respective ones of the m other page buffers assigned to target memory cell 112-2-T.

The voltage 415 applied to data line 125-1 may be based on the data in page buffer 158-1 to be programmed to target memory cell 112-1-T. For example, while transistor 150 is activated, the level of the voltage 415 applied to data line 125-1 may be at a non-inhibit voltage level VdLprog, such as Vss, that allows target memory cell 112-1-T to program, e.g., that allows the threshold voltage of target memory cell 112-1-T to be changed (e.g., shifted) in the event that the threshold voltage of target memory cell 112-1-T might need to be changed to store the one bit of data that is in page buffer 158-1 for single-bit-per-cell programming or to store the respective ones of the m bits of data in the respective ones of the m page buffers assigned to target memory cell 112-1-T for m-bit-per-cell programming. Transistor 150 may be subsequently deactivated, by changing the voltage level of the voltage 405 applied to control line 152 from the voltage level Vact to the voltage level Vdeact, while the voltage 415 applied to data line 125-1 is at the voltage level VdLprog. For example, deactivating transistor 150 maintains voltage level VdLprog on data line 125-1 and electrically isolates data line 125-1 from data line 125-2, and thus electrically isolates data line 125-1 from page buffers 158-1 and 158-2. Note that for single-bit-per-cell programming, while transistor 150 is activated, page buffer 158-1 may be activated to supply voltage 415 to data line 125-1 and page buffer 158-2 may be deactivated, e.g., page buffer 158-2 may be deactivated while page buffer 158-1 is activated. For m-bit-per-cell programming, while transistor 150 is activated, page buffer 158-1 may be activated to supply voltage 415 to data line 125-1 and page buffer 158-2 may be deactivated, e.g., page buffer 158-2 may be deactivated while page buffer 158-1 is activated.

In the event that the threshold voltage of target memory cell 112-1-T might not need to be changed to store the bit of data that is in page buffer 158-1 for single-bit-per-cell programming or to store respective ones of the m bits in the respective ones of the m page buffers assigned to target memory cell 112-1-T for m-bit-per-cell programming, while transistor 150 is activated, the level of the voltage 415 applied to data line 125-1 might be changed from the voltage level VdLprog to an inhibit voltage level Vinh, such as the voltage level Vcc, that inhibits the threshold voltage of target memory cell 112-1-T from being changed, and thus inhibits target memory cell 112-1-T from being programmed. Transistor 150 may then be deactivated while data line 125-1 is at the voltage level Vinh, e.g., to maintain the voltage level Vinh on data line 125-1.

Target memory cell 112-1-T may be inhibited from further programming in the event that it programs, e.g., reaches a target threshold voltage, before other target memory cells that are connected to selected access line 128-1-Sel. For example, program voltages might be applied to selected access line 128-1-Sel, while target memory cell 112-1-T is inhibited, until the other target memory cells that are connected to selected access line 128-1-Sel are programmed or fail to program in certain number of programming operations. Alternatively, target memory cell 112-1-T may be inhibited when target memory cell 112-1-T is at an initial state, e.g., a lowest state, such as an erased state or a state after a healing operation or pre-programming operation has been applied after an erase, and page buffer 158-1 specifies data corresponding to the initial state.

Note that the voltage 415 that is applied by page buffer 158-1 to data line 125-1 while transistor 150 is activated is applied through data line 125-2, in that data line 125-2 is between page buffer 158-1 and data line 125-1 and is connected in series with data line 125-1 while transistor 150 is activated. Therefore, while transistor 150 is activated, voltage 415 may be applied to both data lines 125-1 and 125-2 concurrently, for example. For example, dashed line 411 in FIG. 4 shows when the voltage 415 is at the voltage level Vinh, and thus both data lines 125-1 and 125-2 are at the voltage level Vinh concurrently. Deactivating page buffer 158-1 and activating page buffer 158-2 after transistor 150 is deactivated may cause the voltage 415 on data line 125-2 to drop to the voltage level VdLprog from the voltage level Vinh in the event page buffer 158-2 applies the voltage level VdLprog level to data line 125-2.

The voltage 415 applied to data line 125-2 while transistor 150 is activated may be referred to as a do-not-care voltage, in that it is not intended to be used during the programming of the memory cells 112-2-1 to 112-2-M, such as target memory cell 112-2-T, in string 110-2 selectively connected to data line 125-2. That is, for example, voltage 415 is based on the data to be programmed to target memory cell 112-1-T in string 110-1 selectively connected to data line 125-1. For example, the voltage 415 applied to data line 125-2 may be superseded by the voltage 410 that may be applied to data line 125-2 by page buffer 158-2 while transistor 150 is deactivated and that may be based on the data in page buffer 158-2 to be programmed to target memory cell 112-2-T in string 110-2 selectively connected to data line 125-2.

After transistor 150 is deactivated by changing the voltage level of the voltage 405 applied to control line 152 from the voltage level Vact to the voltage level Vdeact, and thus data line 125-1 is electrically isolated from data line 125-2 and from page buffers 158-1 and 158-2 for single-bit-per-cell programming or from page buffers 158-1 to 158-N for m-bit-per-cell programming, and the voltage 415 on data line 125-1 is either at the voltage level VdLprog or the voltage level Vinh, the voltage 410 applied to data line 125-2 may be left at the non-inhibit voltage level VdLprog that allows target memory cell 112-2-T to program, e.g., that allows the threshold voltage of target memory cell 112-2-T to be changed (e.g., shifted) in the event that the threshold voltage of target memory cell 112-2-T might need to be changed to store the bit of data that is in page buffer 158-2 for single-bit-per-cell programming or to store respective ones of the m bits of data in the respective ones of the m page buffers assigned to target memory cell 112-2-T for m-bit-per-cell programming.

In the event that the threshold voltage of target memory cell 112-2-T might not need to be changed to store the bit of data that is in page buffer 158-2 for single-bit-per-cell programming or to store respective ones of the m bits of data in the respective ones of the m page buffers assigned to target memory cell 112-2-T for m-bit-per-cell programming, after transistor 150 is deactivated, the level of the voltage 410 applied to data line 125-2 might be changed from the voltage level VdLprog to inhibit voltage level Vinh that inhibits the threshold voltage of target memory cell 112-2-T from being changed, and thus inhibits target memory cell 112-2-T from being programmed. Note that while transistor 150 is deactivated, page buffer 158-2 may be activated to supply the voltage 410 to data line 125-2 and page buffer 158-1 may be deactivated, e.g., page buffer 158-1 may be deactivated while page buffer 158-2 is activated.

Target memory cell 112-2-T may be inhibited from further programming in the event that it programs, e.g., reaches a target threshold voltage, before other target memory cells that are connected to selected access line 128-2-Sel. For example, program voltages might be applied to selected access line 128-2-Sel, while target memory cell 112-2-T is inhibited, until the other target memory cells that are connected to selected access line 128-2-Sel are programmed or fail to program in certain number of programming operations. Alternatively, target memory cell 112-2-T may be inhibited when target memory cell 112-2-T is at an initial state, e.g., a lowest state, such as an erased state or a state after a healing operation or pre-programming operation has been applied after an erase, and page buffer 158-2 specifies the bit of data corresponding to the initial state for single-bit-per-cell programming or the respective ones of the m page buffers assigned to target memory cell 112-2-T respectively specify the respective ones of the m bits of data corresponding to the initial state for m-bit-per-cell programming.

While the voltage 415 on data line 125-1 is either at the voltage level VdLprog or the voltage level Vinh and while the voltage 410 applied to data line 125-2 is either at the voltage level VdLprog or the voltage level Vinh, select transistors 116-1 and 116-2 may be concurrently activated from deactivated states by changing the voltage level of the voltage 430 concurrently applied to the select lines 132-1and 132-2 respectively connected to select transistors 116-1 and 116-2 from the deactivation voltage level Vdeact that causes select transistors 116-1 and 116-2 to be deactivated to the activation voltage level Vact that may concurrently activate select transistors 116-1 and 116-2. While the voltage level of the voltage 430 is increased (e.g., concurrently with increasing the voltage level of the voltage 430) from the voltage level Vdeact to the voltage level Vact, the voltage 420 concurrently applied to the selected access lines 128-1-Sel and 128-2-Sel and the voltage 425 concurrently applied to the unselected access lines of the access lines 128-1-1 to 128-1-M and the unselected access lines of the access lines 128-2-1 to 128-2-M are concurrently increased from a voltage level Vlow, such as Vss, to a pass voltage level, such as voltage level Vpass-prog.

The voltage 420 concurrently applied to the selected access lines 128-1-Sel and 128-2-Sel is subsequently increased from the voltage level Vpass-prog to a program voltage level, such as voltage level Vprog, while select transistors 116-1 and 116-2 are activated, while the voltage 425 concurrently applied to the unselected access lines of the access lines 128-1-1 to 128-1-M and the unselected access lines of the access lines 128-2-1 to 128-2-M remains at the voltage level Vpass-prog, and while the voltage 415 on data line 125-1 is either at the voltage level VdLprog or the voltage level Vinh and the voltage 410 applied to data line 125-2 is either at the voltage level VdLprog or the voltage level Vinh.

In some examples, while select transistors 116-1 and 116-2 are activated and data lines 125-1 and 125-2 are at the voltage level VdLprog, the voltage level VdLprog may be transferred to the channels of target memory cells 112-1-T and 112-2-T while the selected access lines 128-1-Sel and 128-2-Sel, and thus the control gates of target memory cells 112-1-T and 112-2-T, are at the voltage level Vprog. The difference between the voltage level Vprog on the control gates of target memory cells 112-1-T and 112-2-T and the voltage level VdLprog on the channels of target memory cells 112-1-T and 112-2-T, for example, may be sufficient to cause target memory cells 112-1-T and 112-2-T to program, e.g., may be sufficient to cause a shift in the threshold voltages of target memory cells 112-1-T and 112-2-T.

In some examples, while the data line 125-1 is at the voltage level Vinh and while the voltage level Vact is applied to select transistor 116-1 so that transistor 116-1 is activated and connects the data line 125-1 that is at the voltage level Vinh to a channel of target memory cell 112-1-T, voltage might be transferred from data line 125-1 to the channel of target memory cell 112-1-T until select transistor 116-1 becomes deactivated, while the voltage level Vact is applied to select transistor 116-1. Similarly, for example, while the data line 125-2 is at the voltage level Vinh and while the voltage level Vact is applied to select transistor 116-2 so that transistor 116-2 is activated and connects the data line 125-2 that is at the voltage level Vinh to a channel of target memory cell 112-2-T, voltage might be transferred from data line 125-2 to the channel of target memory cell 112-2-T until select transistor 116-2 becomes deactivated, while the voltage level Vact is applied to select transistor 116-2. While select transistors 116-1 and 116-2 are deactivated in this manner, for example, the voltage level Vpass-prog applied to the unselected access lines of the access lines 128-1-1 to 128-1-M, the unselected access lines of the access lines 128-2-1 to 128-2-M, and the selected access lines 128-1-Sel and 128-2-Sel and the voltage level Vprog that is subsequently applied to the selected access lines 128-1-Sel and 128-2-Sel act to boost the voltage on the channels of target memory cells 112-1-T and 112-2-T to levels where the difference between the voltage on the channels of target memory cells 112-1-T and 112-2-T and the voltage level Vprog applied to the selected access lines 128-1-Sel and 128-2-Sel, and thus to the control gates of target memory cells 112-1-T and 112-2-T, may be insufficient to cause target memory cells 112-1-T and 112-2-T to program, e.g., may be insufficient to cause a shift in the threshold voltages of target memory cells 112-1-T and 112-2-T, and thus target memory cells 112-1-T and 112-2-T may be inhibited from being programmed.

After the voltage level Vprog is concurrently applied to the selected access lines 128-1-Sel and 128-2-Sel, the target memory cells 112-1-T and 112-2-T respectively connected to selected access lines 128-1-Sel and 128-2-Sel may be sensed by applying a program verify voltage to the selected access lines 128-1-Sel and 128-2-Sel during a program verify operation to determine whether target memory cells 112-1-T and 112-2-T have been respectively programmed to the data values in page buffers 158-1 and 158-2. When it is determined that the target memory cells 112-1-T and 112-2-T are not programmed to the data values in page buffers 158-1 and 158-2, the voltage level Vprog concurrently applied to the selected access lines 128-1-Sel and 128-2-Sel may be incremented by a step voltage. The target memory cells 112-1-T and 112-2-T may then be sensed with the program verify voltage to determine whether target memory cells 112-1-T and 112-2-T have been respectively programmed to the respective bits of data respectively in page buffers 158-1 and 158-2 for single-bit-per-cell programming or, for m-bit-per-cell-programming, target memory cell 112-1-T is programmed to the m bits in the m page buffers, of the page buffers 158-1 and 158-N, assigned to target memory cell 112-1-T and target memory cell 112-2-T is programmed to the m bits in the m page buffers, of the page buffers 158-1 and 158-N, assigned to target memory cell 112-2-T. The program voltage level may continue to be incremented and target memory cells 112-1-T and 112-2-T may continue to be sensed until it is verified that target memory cells 112-1-T and 112-2-T are respectively programmed to the respective bits of data respectively in page buffers 158-1 and 158-2 for single-bit-per-cell programming or, for m-bit-per-cell-programming, target memory cell 112-1-T is programmed to the m bits in the m page buffers assigned to target memory cell 112-1-T and target memory cell 112-2-T is programmed to the m bits in the m page buffers assigned to target memory cell 112-2-T, or until the target memory cells 112-1-T and 112-2-T fail to verify in a certain number of program/program verify operations.

Figure 5:
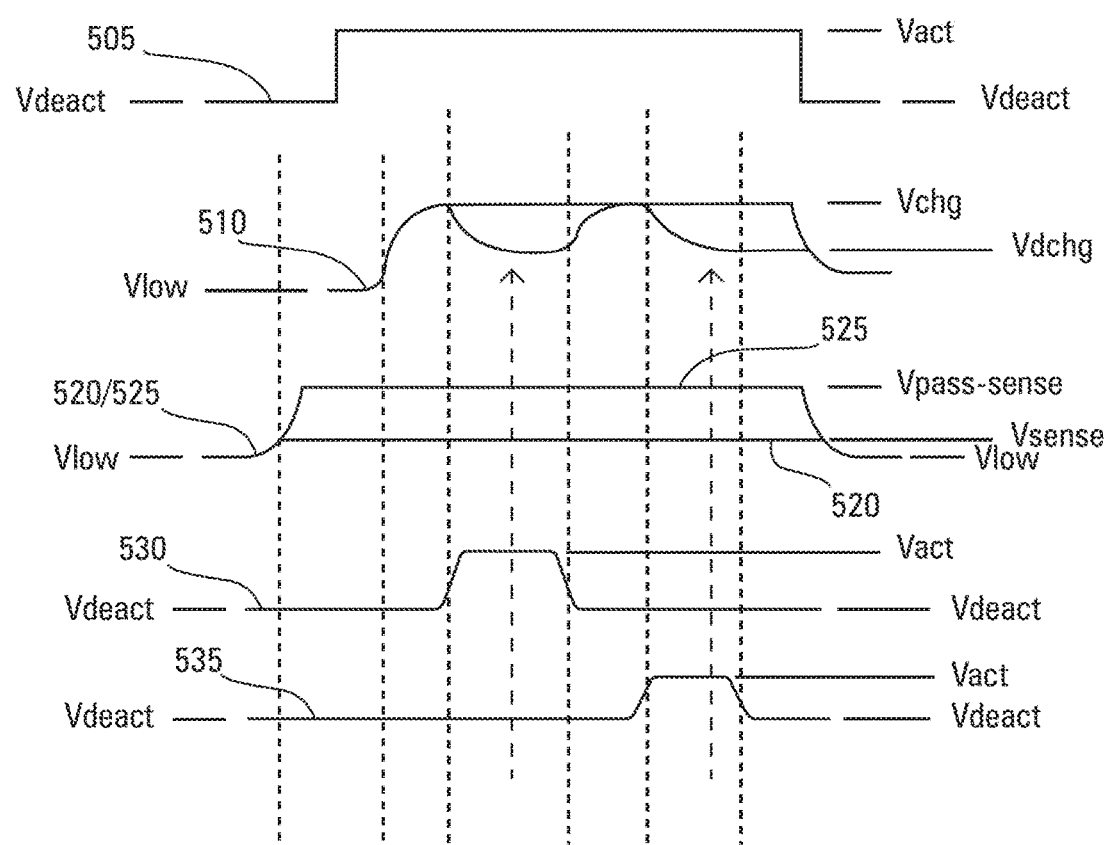
FIG. 5 presents a timing diagram for an example of a sensing operation.

FIG. 5 presents a timing diagram for an example of a sensing operation, e.g., during a single-bit-per cell (e.g., a two-level) sensing mode, that senses the target memory cell 112-1-T of the memory cells 112-1-1 to 112-1-M in the string 110-1 in FIG. 1 when targeted for sensing, e.g., as a single-bit memory cell, and the target memory cell 112-2-T of the memory cells 112-2-1 to 112-2-M in the string 110-2 in FIG. 1 when targeted for sensing, e.g., as a single-bit memory cell. The remaining memory cells of the memory cells 112-1-1 to 112-1-M in the string 110-1 are untargeted memory cells of the memory cells 112-1-1 to 112-1-M in the string 110-1 and are not targeted for sensing, and the remaining memory cells of the memory cells 112-2-1 to 112-2-M in the string 110-2 are untargeted memory cells of the memory cells 112-2-1 to 112-2-M in the string 110-2 and are not targeted for sensing. Note that the sensing operation in the example of FIG. 5 might be applied during an m-bit-per-cell (e.g., a $2^m$-level) sensing mode for sensing target memory cell 112-1-T, e.g., as an m-bit memory cell, and target memory cell 112-2-T, e.g., as an m-bit memory cell. Note that m=1 for the single-bit-per-cell sensing mode.

The sensing operation, for example, might be a program verify operation that may be performed to determine whether the target memory cells 112-1-T and 112-2-T have programmed, e.g., reached at least a target threshold voltage, in response to a program voltage being applied to the selected access lines 128-1-Sel and 128-2-Sel respectively connected to target memory cells 112-1-T and 112-2-T. Alternatively, the sensing operation, for example, might be a read operation performed on the target memory cells 112-1-T and 112-2-T.

A voltage 505 may be applied to the control line 152 that is connected to the control gate of transistor 150. A voltage 510 may be concurrently applied to data lines 125-1 and 125-2, e.g., from sense amplifier 155 or one of the page buffers 158-1 or 158-2 when transistor 150 is activated to connect data lines 125-1 and 125-2 in series. For example, voltage 510 may only be applied to data line 125-2 before transistor 150 is activated, and when transistor 150 is activated to connect data lines 125-1 and 125-2 in series, voltage 510 is applied to data line 125-1 through data line 125-2 so that voltage 510 is concurrently applied to data lines 125-1 and 125-2. That is, for example, FIG. 5 shows voltage 510 concurrently applied to data lines 125-1 and 125-2.

A voltage 520 may be concurrently applied to the selected access lines 128-1-Sel and 128-2-Sel respectively connected to the control gates of target memory cells 112-1-T and 112-2-T. A voltage 525 may be concurrently applied to the unselected access lines of the access lines 128-1-1 to 128-1-M respectively connected to the control gates of the untargeted memory cells of the memory cells 112-1-1 to 112-1-M and the unselected access lines of the access lines 128-2-1 to 128-2-M respectively connected to the control gates of the untargeted memory cells of the memory cells 112-2-1 to 112-2-M. A voltage 530 may be concurrently applied to select line 130-1 connected to the control gate of select transistor 114-1 and to select line 132-1 connected to the control gate of select transistor 116-1, and a voltage 535 may be concurrently applied to select line 130-2 connected to the control gate of select transistor 114-2 and to select line 132-2 connected to the control gate of select transistor 116-2. In some examples, sources 120-1 and 120-2 might be grounded during the sensing operation.

The sensing operation might commence by increasing the level of voltage 520 to a sense voltage level and the level of the voltage 525 to a pass voltage level. For example, the level of voltage 520 concurrently applied to the selected access lines 128-1-Sel and 128-2-Sel, and thus to the control gates of target memory cells 112-1-T and 112-2-T, may be increased from a voltage level Vlow, such as Vss, to a sense voltage level Vsense, such as a read voltage when the sensing operation is a read operation or a program verify voltage when the sensing operation is a program verify operation.

The level of the voltage 525 concurrently applied to the unselected access lines of the access lines 128-1-1 to 128-1-M, and thus to the control gates of the untargeted memory cells of the memory cells 112-1-1 to 112-1-M, and to the unselected access lines of the access lines 128-2-1 to 128-2-M, and thus to the control gates of the untargeted memory cells of the memory cells 112-2-1 to 112-2-M, for example, may be increased from the voltage level Vlow to a voltage level Vpass-sense that is sufficient to activate the untargeted memory cells of the memory cells 112-1-1 to 112-1-M respectively connected to the unselected access lines of the access lines 128-1-1 to 128-1-M and the untargeted memory cells of the memory cells 112-2-1 to 112-2-M respectively connected to the unselected access lines of the access lines 128-2-1 to 128-2-M. That is, for example, the activated untargeted memory cells may pass current. Voltage 520 may remain at sense voltage level Vsense during the sense operation, and voltage 525 may remain at voltage level Vpass-sense during the sense operation. That is, for example, the unselected access lines of the access lines 128-1-1 to 128-1-M and the unselected access lines of the access lines 128-2-1 to 128-2-M may be at voltage level Vpass-sense while the selected access lines 128-1-Sel and 128-2-Sel are at voltage level Vsense.

While voltage 520 is at sense voltage level Vsense and voltage 525 is at voltage level Vpass-sense, transistor 150 may then be activated from a deactivated state by changing the voltage level of the voltage 505 applied to control line 152 from the deactivation voltage level Vdeact to the activation voltage level Vact. Transistor 150 may remain activated during the sensing operation, for example. That is, for example, transistor 150 may remain activated while the unselected access lines of the access lines 128-1-1 to 128-1-M and the unselected access lines of the access lines 128-2-1 to 128-2-M are at voltage level Vpass-sense and while the selected access lines 128-1-Sel and 128-2-Sel are at voltage level Vsense. Note that, when transistor 150 is activated, data lines 125-1 and 125-2 are connected in series.

When transistor 150 is activated, voltage 510 is concurrently applied to data lines 125-1 and 125-2 that are connected in series by activated transistor 150. While transistor 150 is activated and while voltage 520 is at sense voltage level Vsense and the level of the voltage 525 is at voltage level Vpass-sense, the voltage 510 concurrently applied to data lines 125-1 and 125-2 may be increased from a voltage level Vlow, such as Vss, to a voltage level Vchg. Subsequently, while voltage 520 is at sense voltage level Vsense, voltage 525 is at voltage level Vpass-sense, transistor 150 is activated, and select transistors 114-2 and 116-2 are deactivated, select transistors 114-1 and 116-1 may be concurrently activated (e.g., in response to an address being received that addresses target memory cell 112-1-T) by increasing the voltage level of the voltage 530 concurrently applied to the select lines 130-1 and 132-1 from the deactivation voltage level Vdeact to the activation voltage level Vact. Activating select transistor 114-1 may connect string 110-1, and thus target memory cell 112-1-T, to source 120-1, and activating select transistor 116-1 may connect string 110-1, and thus target memory cell 112-1-T, to data line 125-1, and thus to data line 125-2. The address that addresses target memory cell 112-1-T, for example, may cause a data value corresponding to the sensed state of target memory cell 112-1-T to be stored in page buffer 158-1.

Note that select transistors 114-2 and 116-2 are deactivated when the voltage 535 concurrently applied to the select lines 130-2 and 132-2 that are respectively connected to select transistors 114-2 and 116-2 is at the voltage level Vdeact so that string 110-2, and thus target memory cell 112-2-T, is disconnected from source 120-2 and data line 125-2, and thus data line 125-1. That is, for example, when select transistor 116-2 is deactivated, string 110-2, and thus target memory cell 112-2-T, is disconnected from sense amplifier 155 and page buffers 158-1 and 158-2.

When the sense voltage level Vsense applied to selected access line 128-1-Sel is insufficient to activate the target memory cell 112-1-T, a current might not be able to flow through the series-connected data lines 125-1 and 125-2 and through the string 110-1 that includes target memory cell 112-1-T. As such, for example, sense amplifier 155 might not sense a current on the series-connected data lines 125-1 and 125-2, and thus data lines 125-1 and 125-2 may remain at the voltage level Vchg. For example, sense amplifier 155 might sense the voltage level Vchg on data lines 125-1 and 125-2 when target memory cell 112-1-T remains deactivated in response to the sense voltage level Vsense being applied to selected access line 128-1-Sel.

When the sense voltage level Vsense applied to selected access line 128-1-Sel is sufficient to activate the target memory cell 112-1-T, current may flow through the series-connected data lines 125-1 and 125-2 and through the string 110-1 that includes target memory cell 112-1-T to source 120-1, for example. As such, for example, sense amplifier 155 might sense a current flow on the series-connected data lines 125-1 and 125-2. The current flow might cause the level of the voltage 510 to decrease from the voltage level Vchg to a voltage level the voltage level Vdchg while the voltage 530 is at the voltage level Vact and select transistors 130-1 and 132-1 are activated. For example, sense amplifier 155 might sense the voltage level Vdchg on data lines 125-1 and 125-2 when target memory cell 112-1-T is activated in response to the sense voltage level Vsense being applied to selected access line 128-1-Sel.

Sense amplifier 155 not detecting a current flow and/or sense amplifier 155 detecting the voltage level Vchg, may be indicative of the threshold voltage of target memory cell 112-1-T being greater than the sense voltage level Vsense. For example, when sense voltage level Vsense is a program verify voltage during a program verify operation, sense amplifier 155 not detecting a current flow and/or sense amplifier 155 detecting the voltage level Vchg may be indicative of target memory cell 112-1-T being programmed to a desired data state, e.g., target memory cell 112-1-T passing the program verify operation, and a data value in page buffer 158-1 might be changed, e.g., to a logical one (1), to indicate that target memory cell 112-1-T is programmed.

When sense voltage level Vsense is a read voltage during a read operation for a single-bit-per-cell read operation, for example, sense amplifier 155 not detecting a current flow and/or sense amplifier 155 detecting the voltage level Vchg may be indicative of target memory cell 112-1-T having a threshold voltage corresponding (e.g., assigned) to a particular data value, such as a logical 1, and thus may be indicative of target memory cell 112-1-T storing a logical 1. For example, the read operation may read the logical 1 stored on target memory cell 112-1-T. For example, the logical 1 might be stored in page buffer 158-1 and be subsequently latched by data latch 160 to I/O bus 162. Note, for example, that page buffer 158-1 may be used in response to an address being received that addresses target memory cell 112-1-T.

Sense amplifier 155 detecting a current flow and/or sense amplifier 155 detecting the voltage level Vdchg, may be indicative of the threshold voltage of target memory cell 112-1-T being less than the sense voltage level Vsense. For example, when sense voltage level Vsense is the program verify voltage during the program verify operation, sense amplifier 155 detecting a current flow and/or sense amplifier 155 detecting the voltage level Vdchg may be indicative of target memory cell 112-1-T not being programmed to a desired data state, e.g., indicative of target memory cell 112-1-T failing the program verify operation, and a data value in page buffer 158-1 might be left unchanged, e.g., at a logical zero (0), to indicate that target memory cell 112-1-T is not programmed. For example, logical 0 might indicate that an increased program voltage might need to be applied to target memory cell 112-1-T.

When sense voltage level Vsense is a read voltage for a single-bit-per-cell read operation, for example, sense amplifier 155 detecting a current flow and/or sense amplifier 155 detecting the voltage level Vdchg may be indicative of target memory cell 112-1-T having a threshold voltage corresponding to (e.g., assigned to) a different particular data value, such as a logical 0, and thus may be indicative of target memory cell 112-1-T storing a logical 0. For example, the read operation may read the logical 0 stored on target memory cell 112-1-T. For example, the logical 0 might be stored in page buffer 158-1 and be subsequently latched by data latch 160 to I/O bus 162. Note that for an m-bit-per-cell read operation, respective ones of m-bits of data read from target memory cell 112-1-T are respectively stored in respective ones of the m page buffers assigned to target memory cell 112-1-T.

While voltage 520 is at sense voltage level Vsense, voltage 525 is at voltage level Vpass-sense, transistor 150 is activated, select transistors 114-1 and 116-1 may be concurrently deactivated by decreasing the voltage level of the voltage 530 concurrently applied to the select lines 130-1 and 132-1 from the activation voltage level Vact to the deactivation voltage level Vdeact. Subsequently, while voltage 520 is at sense voltage level Vsense, voltage 525 is at voltage level Vpass-sense, transistor 150 is activated, and select transistors 114-1 and 116-1 are deactivated, select transistors 114-2 and 116-2 may be concurrently activated (e.g., in response to an address being received that addresses target memory cell 112-2-T) by increasing the voltage level of the voltage 535 concurrently applied to the select lines 130-2 and 132-2 from the deactivation voltage level Vdeact to the activation voltage level Vact. Activating select transistor 114-2 may connect string 110-2, and thus target memory cell 112-2-T, to source 120-2, and activating select transistor 116-2 may connect string 110-2, and thus target memory cell 112-2-T, to data line 125-2, and thus to data line 125-1. Note that when select transistor 116-1 is deactivated, string 110-1, and thus target memory cell 112-1-T, is disconnected from sense amplifier 155 and page buffers 158-1 and 158-2. The address that addresses target memory cell 112-2-T, for example, may cause a single bit of data corresponding to the sensed state of target memory cell 112-2-T to be stored in page buffer 158-2 for single-bit-per-cell sensing or respective ones of m bits of data corresponding to the sensed state of target memory cell 112-2-T to be respectively stored in respective ones of the m page buffers assigned to target memory cell 112-2-T for m-bit-per-cell sensing.

When the sense voltage level Vsense applied to selected access line 128-2-Sel is insufficient to activate the target memory cell 112-2-T, a current might not be able to current to flow through the series-connected data lines 125-1 and 125-2 and through the string 110-2 that includes target memory cell 112-2-T. As such, for example, sense amplifier 155 might not sense a current on the series-connected data lines 125-1 and 125-2, and thus data lines 125-1 and 125-2 may remain at the voltage level Vchg. For example, sense amplifier 155 might sense the voltage level Vchg on data lines 125-1 and 125-2 when target memory cell 112-2-T remains deactivated in response to the sense voltage level Vsense being applied to selected access line 128-2-Sel.

When the sense voltage level Vsense applied to selected access line 128-2-Sel is sufficient to activate the target memory cell 112-2-T, current may flow through the series-connected data lines 125-1 and 125-2 and through the string 110-2 that includes target memory cell 112-2-T to source 120-2. As such, for example, sense amplifier 155 might sense a current flow on the series-connected data lines 125-1 and 125-2. The current flow might cause the level of the voltage 510 to decrease from the voltage level Vchg to the voltage level Vdchg while the voltage 535 is at the voltage level Vact and the select transistors 114-2 and 116-2 are activated. For example, sense amplifier 155 might sense the voltage level Vdchg on data lines 125-1 and 125-2 when target memory cell 112-2-T is activated in response to the sense voltage level Vsense being applied to selected access line 128-2-Sel.

Sense amplifier 155 not detecting a current flow and/or sense amplifier 155 detecting the voltage level Vchg, may be indicative of the threshold voltage of target memory cell 112-2-T being greater than the sense voltage level Vsense. For example, when sense voltage level Vsense is a program verify voltage during a program verify operation, sense amplifier 155 not detecting a current flow and/or sense amplifier 155 detecting the voltage level Vchg may be indicative of target memory cell 112-2-T being programmed to a desired data state, e.g., target memory cell 112-2-T passing the program verify operation, and a data value in page buffer 158-2 might be changed, e.g., to a logical one (1), to indicate that target memory cell 112-2-T is programmed.

When sense voltage level Vsense is a read voltage for a single-bit-per-cell read operation, for example, sense amplifier 155 not detecting a current flow and/or sense amplifier 155 detecting the voltage level Vchg may be indicative of target memory cell 112-2-T having a threshold voltage corresponding to (e.g., assigned to) a particular data value, such as a logical 1, and thus may be indicative of target memory cell 112-2-T storing a logical 1. For example, the read operation may read the logical 1 stored on target memory cell 112-2-T. For example, the logical 1 might be stored in page buffer 158-2 and be subsequently latched by data latch 160 to I/O bus 162. Note, for example, that page buffer 158-2 may be used in response to an address being received that addresses target memory cell 112-2-T.

Sense amplifier 155 detecting a current flow and/or sense amplifier 155 detecting the voltage level Vdchg, may be indicative of the threshold voltage of target memory cell 112-2-T being less than the sense voltage level Vsense. For example, when sense voltage level Vsense is a program verify voltage during the program verify operation, sense amplifier 155 detecting a current flow and/or sense amplifier 155 detecting the voltage level Vdchg may be indicative of target memory cell 112-2-T not being programmed to a desired data state, e.g., indicative of target memory cell 112-2-T failing the program verify operation, and a data value in page buffer 158-1 might remain unchanged, e.g., at a logical zero (0), to indicate that target memory cell 112-2-T is not programmed. For example, logical 0 might indicate that an increased program voltage might need to be applied to target memory cell 112-2-T.

When sense voltage level Vsense is a read voltage for a single-bit-per-cell read operation, for example, sense amplifier 155 detecting a current flow and/or sense amplifier 155 detecting the voltage level Vdchg may be indicative of target memory cell 112-2-T of having a threshold voltage corresponding to (e.g., assigned to) a different particular data value, such as a logical 0, and thus may be indicative of target memory cell 112-2-T storing a logical 0. For example, the read operation may read the logical 0 stored on target memory cell 112-2-T. For example, the logical 0 might be stored in page buffer 158-2 and be subsequently latched by data latch 160 to I/O bus 162. Note that for an m-bit-per-cell read operation, respective ones of m-bits of data read from target memory cell 112-2-T are respectively stored in respective ones of the m page buffers assigned to target memory cell 112-2-T.

Figure 6:
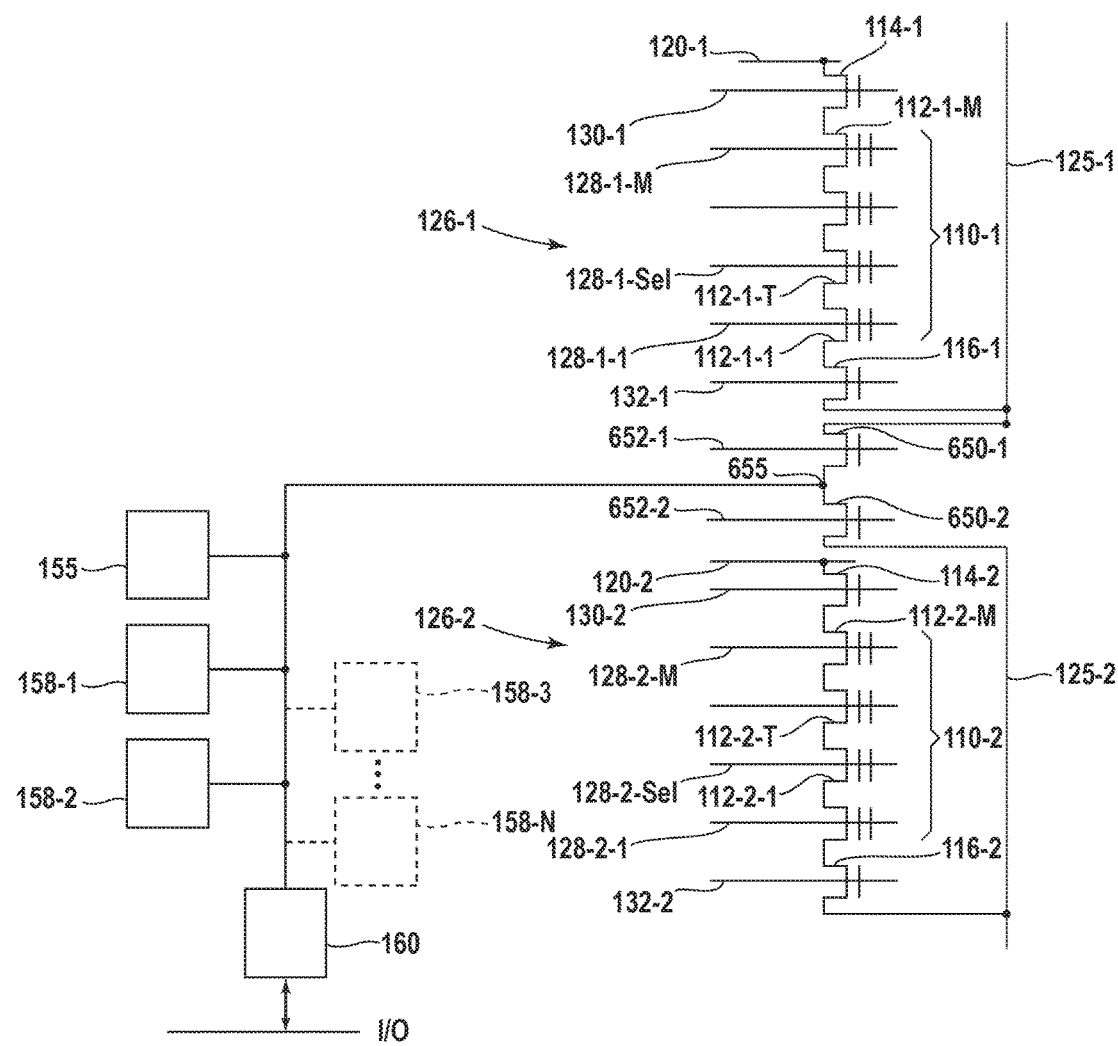
FIG. 6 is a schematic diagram of another example of a portion of a memory array.

FIG. 6 is a schematic diagram of another example of a portion of a memory array. Common numbering is used in FIGS. 1 and 6 for similar (e.g., the same) components. For example, the commonly numbered components may be as described above in conjunction with FIG. 1.

Series-connected transistors 650-1 and 650-2, such as pass transistors, may be connected between data lines 125-1 and 125-2. For example, transistor 650-1 may be connected to (e.g., in series with) data line 125-1, and transistor 650-1 may be connected to (e.g., in series with) data line 125-2. Series-connected transistors 650-1 and 650-2 may selectively electrically connect data line 125-1 to (e.g., in series with) data line 125-2. That is, for example, when series-connected transistors 650-1 and 650-2 are both (e.g., are concurrently) activated, series-connected transistors 650-1 and 650-2 electrically connect data line 125-1 to (e.g., in series with) data line 125-2. When one of transistors 650-1 and 650-2 is deactivated and the other one of transistors 650-1 and 650-2 is activated, the deactivated one of transistors 650-1 and 650-2 electrically isolates data line 125-1 from data line 125-2. When both of transistors 650-1 and 650-2 are deactivated, for example, data line 125-1 is electrically isolated from data line 125-2. Control gates of transistors 650-1 and 650-2 may be respectively connected to control lines 652-1 and 652-2, for example.

In the example of FIG. 6, sense amplifier 155, page buffers 158-1 and 158-2, and data latch 160 may be connected to a node 655 between transistor 650-1 and transistor 650-2, where transistor 650-1 is connected in series between data line 125-1 and node 655 and transistor 650-2 is connected in series between data line 125-2 and node 655. Transistor 650-1, for example, may selectively connect node 655 to data line 110-1 so that transistor 650-1 selectively connects sense amplifier 155, page buffers 158-1 and 158-2, and data latch 160 in parallel to data line 110-1 through node 655. Transistor 650-2, for example, may selectively connect node 655 to data line 110-2 so that transistor 650-2 selectively connects sense amplifier 155, page buffers 158-1 and 158-2, and data latch 160 in parallel to data line 110-2 through node 655.

In other examples, there might be additional page buffers, such as the page buffers 158-3 to 153-N indicated by dashed lines in FIG. 6. Transistor 650-1, for example, may selectively connect node 655 to data line 110-1 so that transistor 650-1 selectively connects sense amplifier 155, page buffers 158-1 to 158-N, and data latch 160 in parallel to data line 110-1 through node 655. Transistor 650-2, for example, may selectively connect node 655 to data line 110-2 so that transistor 650-2 selectively connects sense amplifier 155, page buffers 158-1 to 158-N, and data latch 160 in parallel to data line 110-2 through node 655. Note, for example, that N=2 for the examples discussed above in conjunction with page buffers 158-1 and 158-2.

In some examples, series-connected transistors 650-1 and 650-2 may replace each of the plurality of transistors 150 in FIG. 2. For example, the series-connected transistors 650-1 and 650-2 may be between the portions 210-1 and 210-2 in FIG. 2 and may be at a vertical level that is below the portions 210-1 and 210-2.

In other examples, series-connected transistors 650-1 and 650-2 may replace each of the plurality of transistors 150 in FIG. 3. For example, the series-connected transistors 650-1 and 650-2 may be under (e.g., directly vertically under) portion 210-2 in FIG. 3, e.g., at a vertical level that is directly vertically below portion 210-2. For example, the respective ones of the plurality of transistors 150 in FIG. 3 that may be respectively connected to ends of the respective ones of the plurality of data lines 125-1 and that may be respectively connected to the respective ones of the plurality of data lines 125-2 somewhere between the ends of the respective ones of the plurality of data lines 125-2 may be replaced with respective ones of a plurality of series-connected transistors 650-1 and 650-2.

Figure 7:
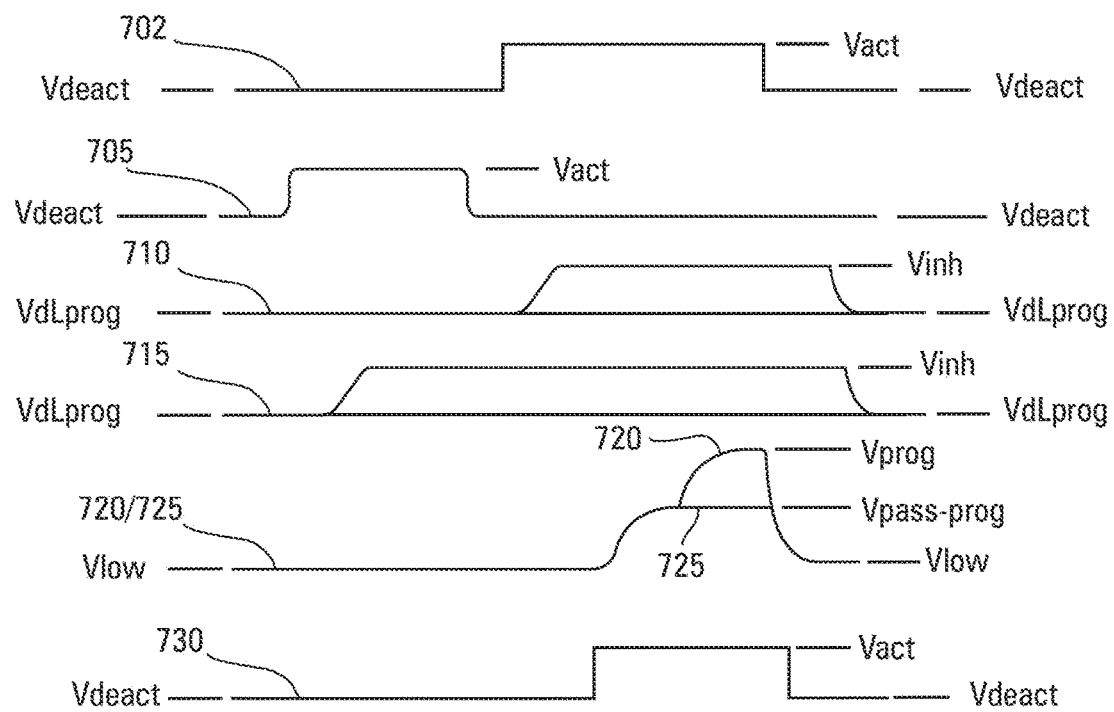
FIG. 7 presents a timing diagram for another example of a programming operation.

FIG. 7 presents a timing diagram for an example of a programming operation, e.g., for programming the configuration of FIG. 6. For example, the programming operation in the example of FIG. 7 might be applied during a single-bit-per-cell-programming mode for programming target memory cell 112-1-T of the memory cells 112-1-1 to 112-1-M in the string 110-1 in FIG. 6 that is targeted for programming, e.g., as a single-bit memory cell, and target memory cell 112-2-T of the memory cells 112-2-1 to 112-2-M in the string 110-2 in FIG. 6 that is targeted for programming, e.g., as a single-bit memory cell. The remaining memory cells of the memory cells 112-1-1 to 112-1-M in the string 110-1 in FIG. 6 are untargeted memory cells of the memory cells 112-1-1 to 112-1-M in the string 110-1 and are not targeted for programming, and the remaining memory cells of the memory cells 112-2-1 to 112-2-M in the string 110-2 in FIG. 6 are untargeted memory cells of the memory cells 112-2-1 to 112-2-M in the string 110-2 and are not targeted for programming. Note that the programming operation in the example of FIG. 7 might be applied during an m-bit-per-cell programming mode for programming target memory cell 112-1-T as an m-bit memory cell and target memory cell 112-2-T as an m-bit memory cell. Note that m=1 for the single-bit-per-cell programming mode.

A voltage 702 may be applied to the control line 652-1 that is connected to the control gate of transistor 650-1, and a voltage 705 may be applied to the control line 652-2 that is connected to the control gate of transistor 650-2. Voltages 710 and 715 may respectively be applied to data lines 125-1 and 125-2. For example, for the single-bit-per-cell programming mode, page buffer 158-2 might supply voltage 715 to node 655, e.g., in response to an address being received that addresses target memory cell 112-2-T, and thus to data line 125-2 through node 655 and through transistor 650-2 when transistor 650-2 is activated. Page buffer 158-1, for the single-bit-per-cell programming mode, for example, might supply voltage 710 to node 655, e.g., in response to an address being received that addresses target memory cell 112-1-T, and thus to data line 125-1 through node 655 and through transistor 650-1 when transistor 650-1 is activated. For the m-bit-per-cell programming mode, for example, one of m page buffers (e.g., page buffer 158-2), of page buffers 158-1 to 158-N, assigned to target memory cell 112-2-T might supply voltage 715 to node 655, e.g., in response to an address being received that addresses target memory cell 112-2-T, and thus to data line 125-2 through node 655 and through transistor 650-2 when transistor 650-2 is activated. For the m-bit-per-cell programming mode, for example, one of m other page buffers (e.g., page buffer 158-1), of page buffers 158-1 to 158-N, assigned to target memory cell 112-1-T might supply voltage 710 to node 655, e.g., in response to an address being received that addresses target memory cell 112-1-T, and thus to data line 125-1 through node 655 and through transistor 650-1 when transistor 650-1 is activated.

A voltage 720 may be concurrently applied to the selected access lines 128-1-Sel and 128-2-Sel, and thus to the control gates of the target memory cells 112-1-T and 112-2-T respectively connected to the selected access lines 128-1-Sel and 128-2-Sel. A voltage 725 may be concurrently applied to the unselected access lines of the access lines 128-1-1 to 128-1-M, and thus the control gates of the untargeted memory cells of the memory cells 112-1-1 to 112-1-M respectively connected to the unselected access lines of the access lines 128-1-1 to 128-1-M, and to the unselected access lines of the access lines 128-2-1 to 128-2-M, and thus the control gates of the untargeted memory cells of the memory cells 112-2-1 to 112-2-M respectively connected to the unselected access lines of the access lines 128-2-1 to 128-2-M. A voltage 730 may be concurrently applied to the select lines 132-1 and 132-2 respectively connected to the control gates of select transistors 116-1 and 116-2.

The programming operation might commence by loading data (e.g., one bit of data for single-bit-per-cell programming) into page buffer 158-1 that is to be programmed into target memory cell 112-1-T and data (e.g., one bit of data for single-bit-per-cell programming) into page buffer 158-2 that is to be programmed into target memory cell 112-2-T. For example, data latch 160 may receive the data from to I/O bus 162 and respectively latch the data into page buffers 158-1 and 158-2. Note, for example, that for m-bit per cell programming, the programming operation might commence by loading respective ones of the m bits of data to be programmed into target memory cell 112-1-T into respective ones of the m page buffers assigned to target memory cell 112-1-T and by loading respective ones of the m bits of data to be programmed into target memory cell 112-2-T into respective ones of the m other page buffers assigned to target memory cell 112-2-T. For example, data latch 160 may receive the data from to I/O bus 162 and respectively latch the m bits of data to be programmed into target memory cell 112-1-T into respective ones of the m page buffers assigned to target memory cell 112-1-T and the m bits of data to be programmed into target memory cell 112-2-T into respective ones of the m page buffers assigned to target memory cell 112-2-T.

Transistor 650-2 may then be activated from a deactivated state (e.g., while transistor 650-1 is deactivated) by changing the voltage level of the voltage 705 applied to control line 652-2 from the deactivation voltage level Vdeact that may cause transistor 650-2 to be deactivated to an activation voltage level Vact that may activate transistor 650-2. The voltage 715 may be based on the bit of data in page buffer 158-2 to be programmed to target memory cell 112-2-T for single-bit-per-cell programming or on the m bits of data in the respective ones of the m page buffers assigned to target memory cell 112-2-T that are to be programmed into target memory cell 112-2-T for m-bit-per-cell programming and may be applied to data line 125-2 through node 655 and through the activated transistor 650-2 by page buffer 158-2, e.g., while page buffer 158-2 is activated and while page buffer 158-1 is deactivated. For example, while transistor 650-2 is activated, the level of the voltage 715 applied to node 655, and thus to data line 125-2, may be at a non-inhibit voltage level VdLprog that may allow target memory cell 112-2-T to program, e.g., that may allow the threshold voltage of target memory cell 112-2-T to be changed (e.g., shifted) in the event that the threshold voltage of target memory cell 112-2-T might need to be changed to store the bit of data that is in page buffer 158-2 for single-bit-per-cell programming or to store the m bits of data in the respective ones of the m page buffers assigned to target memory cell 112-2-T for m-bit-per-cell programming.

Transistor 650-2 may be subsequently deactivated, by changing the voltage level of the voltage 705 applied to control line 652-2 from the voltage level Vact to the voltage level Vdeact, while the voltage 715 applied to data line 125-2 is at the voltage level VdLprog. For example, deactivating transistor 650-2 may maintain voltage level VdLprog on data line 125-2 and may electrically isolate data line 125-2 from node 655, and thus may electrically isolate data line 125-2 from data line 125-1 and page buffers 158-1 and 158-2.

In the event that the threshold voltage of target memory cell 112-2-T might not need to be changed to store the bit of data that is in page buffer 158-2 for single-bit-per-cell programming or to store the m bits of data in the respective ones of the m page buffers assigned to target memory cell 112-2-T for m-bit-per-cell programming, while transistor 650-2 is activated, the level of the voltage 715 applied to node 655, and thus to data line 125-2, might be changed from the voltage level VdLprog to inhibit voltage level Vinh that may inhibit the threshold voltage of target memory cell 112-2-T from being changed, and thus may inhibit target memory cell 112-2-T from being programmed. Transistor 650-2 may then be deactivated while data line 125-2 is at the voltage level Vinh, e.g., to maintain the voltage level Vinh on data line 125-2.

After transistor 650-2 is deactivated and while data line 125-2 is either at the voltage level VdLprog or voltage level Vinh, transistor 650-1 may then be activated from a deactivated state by changing the voltage level of the voltage 702 applied to control line 652-1 from the deactivation voltage level Vdeact that may cause transistor 650-1 to be deactivated to an activation voltage level Vact that may activate transistor 650-1. The voltage 710 may be based on the bit of data in page buffer 158-1 to be programmed to target memory cell 112-1-T for single-bit-per-cell programming or on the m bits of data in the respective ones of the m page buffers assigned to target memory cell 112-1-T that are to be programmed into target memory cell 112-1-T for m-bit-per-cell programming and may be applied to node 655, and thus to data line 125-1 through node 655 and through the activated transistor 650-1, by page buffer 158-1, e.g., while page buffer 158-1 is activated and while page buffer 158-2 is deactivated. For example, while transistor 650-1 is activated, transistor 650-2 is deactivated, and the voltage 715 on data line 125-2 is either at the voltage level VdLprog or the voltage level Vinh, the voltage 710 may be left at the non-inhibit voltage level VdLprog that may allow target memory cell 112-1-T to program, e.g., that may allow the threshold voltage of target memory cell 112-1-T to be changed (e.g., shifted) in the event that the threshold voltage of target memory cell 112-1-T might need to be changed to store the bit of data that is in page buffer 158-1 for single-bit-per-cell programming or to store the m bits of data in the respective ones of the m page buffers assigned to target memory cell 112-1-T for m-bit-per-cell programming.

In the event that the threshold voltage of target memory cell 112-1-T might not need to be changed to store the bit of data that is in page buffer 158-1 for single-bit-per-cell programming or to store the m bits of data in the respective ones of the m page buffers assigned to target memory cell 112-1-T for m-bit-per-cell programming, while transistor 650-2 is deactivated and the voltage 715 on data line 125-2 is either at the voltage level VdLprog or the voltage level Vinh, the level of the voltage 710 might be changed from the voltage level VdLprog to inhibit voltage level Vinh that may inhibit the threshold voltage of target memory cell 112-1-T being changed, and thus may inhibit target memory cell 112-1-T from being programmed.

While the voltage 715 on data line 125-2 is either at the voltage level VdLprog or the voltage level Vinh and while the voltage 710 applied to data line 125-1, e.g., through node 655 and through activated transistor 650-1, is either at the voltage level VdLprog or the voltage level Vinh, select transistors 116-1 and 116-2 may be concurrently activated from deactivated states by changing the voltage level of the voltage 730 concurrently applied to the select lines 132-1 and 132-2 respectively connected to select transistors 116-1 and 116-2 from the deactivation voltage level Vdeact that may cause select transistors 116-1 and 116-2 to be deactivated to the activation voltage level Vact that may concurrently activate select transistors 116-1 and 116-2. While the voltage level of the voltage 730 is increased (e.g., concurrently with increasing the voltage level of the voltage 730) from the voltage level Vdeact to the voltage level Vact, the voltage 720 concurrently applied to the selected access lines 128-1-Sel and 128-2-Sel and the voltage 725 concurrently applied to the unselected access lines of the access lines 128-1-1 to 128-1-M and the unselected access lines of the access lines 128-2-1 to 128-2-M are concurrently increased from a voltage level Vlow to a pass voltage level, such as voltage level Vpass-prog.

The voltage 720 concurrently applied to the selected access lines 128-1-Sel and 128-2-Sel is subsequently increased from the voltage level Vpass-prog to a program voltage level, such as voltage level Vprog, while select transistors 116-1 and 116-2 are activated, while the voltage 725 concurrently applied to the unselected access lines of the access lines 128-1-1 to 128-1-M and the unselected access lines of the access lines 128-2-1 to 128-2-M remains at the voltage level Vpass-prog, and while the voltage 715 on data line 125-2 is either at the voltage level VdLprog or the voltage level Vinh and the voltage 710 applied to data line 125-1 is either at the voltage level VdLprog or the voltage level Vinh.

A sensing operation for the example of FIG. 6, e.g., during a single-bit-per-cell sensing mode, that senses the target memory cell 112-1-T in the string 110-1 in FIG. 6, e.g., as a single-bit memory cell, and the target memory cell 112-2-T in the string 110-2 in FIG. 6, e.g., as a single-bit memory cell, may be described, for example, with reference to the example of FIG. 5. The sensing operation, for example, might be a program verify operation that may be performed to determine whether the target memory cells 112-1-T and 112-2-T have programmed, e.g., reached at least a target threshold voltage, in response to a program voltage being applied to the selected access lines 128-1-Sel and 128-2-Sel respectively connected to target memory cells 112-1-T and 112-2-T. Alternatively, the sensing operation, for example, might be a read operation performed on the target memory cells 112-1-T and 112-2-T. A sensing operation for the example of FIG. 6 might sense the target memory cell 112-1-T as an m-bit memory cell and the target memory cell 112-2-T an m-bit memory cell for an m-bit-per-cell sensing mode, and may be described, for example, with reference to the example of FIG. 5.

For the example of FIG. 6, the voltage 520 in FIG. 5 may be concurrently applied, e.g., in the manner described above in conjunction with FIGS. 1 and 5, to the selected access lines 128-1-Sel and 128-2-Sel respectively connected to the control gates of target memory cells 112-1-T and 112-2-T. For the example of FIG. 6, the voltage 525 in FIG. 5 may be concurrently applied, e.g., in the manner described above in conjunction with FIGS. 1 and 5, to the unselected access lines of the access lines 128-1-1 to 128-1-M respectively connected to the control gates of the untargeted memory cells of the memory cells 112-1-1 to 112-1-M and the unselected access lines of the access lines 128-2-1 to 128-2-M respectively connected to the control gates of the untargeted memory cells of the memory cells 112-2-1 to 112-2-M.

The sensing operation for the example of FIG. 6 might commence by increasing the level of voltage 520 to a sense voltage level and the level of the voltage 525 to a pass voltage level. For example, the level of voltage 520 concurrently applied to the selected access lines 128-1-Sel and 128-2-Sel, and thus to the control gates of target memory cells 112-1-T and 112-2-T, may be increased from the voltage level Vlow to the sense voltage level Vsense, such as a read voltage when the sensing operation is a read operation or a program verify voltage when the sensing operation is a program verify operation.

The level of the voltage 525 concurrently applied to the unselected access lines of the access lines 128-1-1 to 128-1-M, and thus to the control gates of the untargeted memory cells of the memory cells 112-1-1 to 112-1-M, and to the unselected access lines of the access lines 128-2-1 to 128-2-M, and thus to the control gates of the untargeted memory cells of the memory cells 112-2-1 to 112-2-M, for example, may be increased from the voltage level Vlow to the voltage level Vpass-sense that may be sufficient to activate the untargeted memory cells of the memory cells 112-1-1 to 112-1-M respectively connected to unselected access lines of the access lines 128-1-1 to 128-1-M and the untargeted memory cells of the memory cells 112-2-1 to 112-2-M respectively connected to the unselected access lines of the access lines 128-2-1 to 128-2-M. Voltage 520 may remain at sense voltage level Vsense during the sense operation; voltage 525 may remain at voltage level Vpass-sense during the sense operation; and sources 120-1 and 120-2 may be grounded during the sensing operation.

The voltage 505 in FIG. 5 may be applied concurrently to the control lines 652-1 and 652-2, and thus to the control gates of transistors 650-1 and 650-2 in FIG. 6. For example, while voltage 520 is at sense voltage level Vsense and voltage 525 is at voltage level Vpass-sense, transistors 650-1 and 650-2 may then be activated from a deactivated state by changing the voltage level of the voltage 505 applied to control lines 652-1 and 652-2 from the deactivation voltage level Vdeact to the activation voltage level Vact. Transistors 650-1 and 650-2 may remain activated during the sensing operation, for example. That is, for example, transistors 650-1 and 650-2 may remain activated while the unselected access lines of the access lines 128-1-1 to 128-1-M and the unselected access lines of the access lines 128-2-1 to 128-2-M are at voltage level Vpass-sense and while the selected access lines 128-1-Sel and 128-2-Sel are at voltage level Vsense.

For the example of FIG. 6, the voltage 510 in FIG. 5 may be concurrently applied to data lines 125-1 and 125-2, e.g., from sense amplifier 155 or one of the page buffers 158-1 or 158-2 through node 655 and through transistors 650-1 and 650-2 when transistors 650-1 and 650-2 are activated concurrently, thus allowing data lines 125-1 and 125-2 to receive voltage 510 concurrently. For example, concurrently activated transistors 650-1 and 650-2 may connect node 655 to data lines 125-1 and 125-2 so that data lines 125-1 and 125-2 are connected in parallel to sense amplifier 155, page buffers 158-1 or 158-2 for single-bit-per-cell sensing or page buffers 158-1 to 158-N for m-bit-per-cell sensing, and data latch 160.

Voltage 510, for example, may be applied to node 655, but may not be applied to data lines 125-1 and 125-2 in the example of FIG. 6 before transistors 650-1 and 615-2 are activated. While transistors 650-1 and 650-2 are activated and while voltage 520 is at sense voltage level Vsense and the level of the voltage 525 is at voltage level Vpass-sense, the voltage 510 applied to node 655, and thus concurrently applied to data lines 125-1 and 125-2, may be increased from the voltage level Vlow to the voltage level Vchg.

For the example of FIG. 6, the voltage 530 in FIG. 5 may be concurrently applied, e.g., in the manner described above in conjunction with FIGS. 1 and 5, to select line 130-1 connected to the control gate of select transistor 114-1 and to select line 132-1 connected to the control gate of select transistor 116-1, and the voltage 535 in FIG. 5 may be concurrently applied, e.g., in the manner described above in conjunction with FIGS. 1 and 5, to select line 130-2 connected to the control gate of select transistor 114-2 and to select line 132-2 connected to the control gate of select transistor 116-2. For example, while voltage 520 is at sense voltage level Vsense, voltage 525 is at voltage level Vpass-sense, transistors 650-1 and 650-2 are activated, and select transistors 114-2 and 116-2 are deactivated, select transistors 114-1 and 116-1 may be concurrently activated (e.g., in response to an address being received that addresses target memory cell 112-1-T) by increasing the voltage level of the voltage 530 concurrently applied to the select lines 130-1 and 132-1 from the deactivation voltage level Vdeact to the activation voltage level Vact.

Activating select transistor 114-1 may connect string 110-1, and thus target memory cell 112-1-T, to source 120-1, and activating select transistor 116-1 may connect string 110-1, and thus target memory cell 112-1-T, to data line 125-1. The activated transistors 650-1 and 650-2 may connect data lines 125-1 and 125-2 to node 655, and thus to sense amplifier 155 and page buffers 158-1 and 158-2 through node 655. The address that addresses target memory cell 112-1-T, for example, may cause a data value corresponding to the sensed state of target memory cell 112-1-T to be stored in page buffer 158-1.

Note that select transistors 114-2 and 116-2 may be deactivated when the voltage 535 concurrently applied to the select lines 130-2 and 132-2 that are respectively connected to select transistors 114-2 and 116-2 is at the voltage level Vdeact so that string 110-2, and thus target memory cell 112-2-T, is disconnected from source 120-2 and data line 125-2, and thus node 655 and data line 125-1. That is, for example, when select transistor 116-2 is deactivated, string 110-2, and thus target memory cell 112-2-T, is disconnected from sense amplifier 155 and page buffers 158-1 and 158-2 for single-bit-per-cell sensing or page buffers 158-1 to 158-N for m-bit-per-cell sensing.

When the sense voltage level Vsense applied to selected access line 128-1-Sel is insufficient to activate the target memory cell 112-1-T, a current might not be able to flow through node 655, data lines 125-1 and 125-2, and the string 110-1 that includes target memory cell 112-1-T. As such, for example, sense amplifier 155 might not sense a current at node 655, and thus on data line 125-1, and thus data lines 125-1 and 125-2 may remain at the voltage level Vchg. For example, sense amplifier 155 might sense the voltage level Vchg on node 655, and thus data lines 125-1 and 125-2, when target memory cell 112-1-T remains deactivated in response to the sense voltage level Vsense being applied to selected access line 128-1-Sel.

When the sense voltage level Vsense applied to selected access line 128-1-Sel is sufficient to activate the target memory cell 112-1-T, current may flow through node 655, the data lines 125-1 and 125-2, and the string 110-1 that includes target memory cell 112-1-T to source 120-1, for example. As such, for example, sense amplifier 155 might sense a current flow at node 655, and thus on the data lines 125-1 and 125-2. The current flow might cause the level of the voltage 510 to decrease from the voltage level Vchg to the voltage level the voltage level Vdchg while the voltage 530 is at the voltage level Vact and the select transistors 114-1 and 116-1 are activated. For example, sense amplifier 155 might sense the voltage level Vdchg on node 655, and thus on data lines 125-1 and 125-2, when target memory cell 112-1-T is activated in response to the sense voltage level Vsense being applied to selected access line 128-1-Sel.

Subsequently, select transistors 114-1 and 116-1 may be concurrently deactivated by decreasing the voltage level of the voltage 530 concurrently applied to the select lines 130-1 and 132-1 from the activation voltage level Vact to the deactivation voltage level Vdeact. Then, for example, while voltage 520 is at sense voltage level Vsense, voltage 525 is at voltage level Vpass-sense, transistors 650-1 and 650-2 are activated, and select transistors 114-1 and 116-1 are deactivated, select transistors 114-2 and 116-2 may be concurrently activated (e.g., in response to an address being received that addresses target memory cell 112-2-T) by increasing the voltage level of the voltage 535 concurrently applied to the select lines 130-2 and 132-2 from the deactivation voltage level Vdeact to the activation voltage level Vact.

Activating select transistor 114-2 may connect string 110-2, and thus target memory cell 112-2-T, to source 120-2, and activating select transistor 116-2 may connect string 110-2, and thus target memory cell 112-2-T, to data line 125-2. The activated transistors 650-1 and 650-2 may connect data lines 125-1 and 125-2 to node 655, and thus to sense amplifier 155 and page buffers 158-1 and 158-2 for single-bit-per-cell sensing or page buffers 158-1 to 158-N for m-bit-per-cell sensing through node 655. The address that addresses target memory cell 112-2-T, for example, may cause a single bit of data corresponding to the sensed state of target memory cell 112-1-T to be stored in page buffer 158-2 for single-bit-per-cell sensing or respective ones m bits of data corresponding to the sensed state of target memory cell 112-1-T to be respectively stored in respective ones of the m page buffers assigned to target memory cell 112-1-T for m-bit-per-cell sensing.

Note that select transistors 114-1 and 116-1 may be deactivated when the voltage 530 concurrently applied to the select lines 130-1 and 132-1 that are respectively connected to select transistors 114-1 and 116-1 is at the voltage level Vdeact so that string 110-1, and thus target memory cell 112-1-T, is disconnected from source 120-1 and data line 125-1, and thus node 655 and data line 125-2. That is, for example, when select transistor 116-1 is deactivated, string 110-1, and thus target memory cell 112-1-T, is disconnected from sense amplifier 155 and page buffers 158-1 and 158-2.

When the sense voltage level Vsense applied to selected access line 128-2-Sel is insufficient to activate the target memory cell 112-2-T, a current might not be able to flow through node 655, data lines 125-1 and 125-2, and the string 110-2 that includes target memory cell 112-2-T. As such, for example, sense amplifier 155 might not sense a current at node 655, and thus on data line 125-2, and thus data lines 125-1 and 125-2 may remain at the voltage level Vchg. For example, sense amplifier 155 might sense the voltage level Vchg on node 655, and thus data lines 125-1 and 125-2, when target memory cell 112-2-T remains deactivated in response to the sense voltage level Vsense being applied to selected access line 128-2-Sel.

When the sense voltage level Vsense applied to selected access line 128-2-Sel is sufficient to activate the target memory cell 112-2-T, current may flow through node 655, the data lines 125-1 and 125-2, and the string 110-2 that includes target memory cell 112-2-T to source 120-2, for example. As such, for example, sense amplifier 155 might sense a current flow at node 655, and thus on the data lines 125-1 and 125-2. The current flow might cause the level of the voltage 510 to decrease from the voltage level Vchg to the voltage level the voltage level Vdchg while the voltage 535 is at the voltage level Vact and transistors 114-2 and 116-2 are activated. For example, sense amplifier 155 might sense the voltage level Vdchg on node 655, and thus on data lines 125-1 and 125-2, when target memory cell 112-2-T is activated in response to the sense voltage level Vsense being applied to selected access line 128-2-Sel.

Sense amplifier 155 not detecting a current flow and/or sense amplifier 155 detecting the voltage level Vchg, may be indicative of the threshold voltage of a target memory cell being greater than the sense voltage level Vsense applied to the target memory cell. For example, when sense voltage level Vsense is a program verify voltage during a program verify operation, sense amplifier 155 not detecting a current flow and/or sense amplifier 155 detecting the voltage level Vchg may be indicative of the target memory cell 112-1-T being programmed to a desired data state, e.g., the target memory cell passing the program verify operation. When sense voltage level Vsense is a read voltage during a read operation, for example, sense amplifier 155 not detecting a current flow and/or sense amplifier 155 detecting the voltage level Vchg may be indicative of the target memory cell having a threshold voltage corresponding to (e.g., assigned to) a particular data value and thus may be indicative of the target memory cell storing that data value.

Sense amplifier 155 detecting a current flow and/or sense amplifier 155 detecting the voltage level Vdchg, may be indicative of the threshold voltage of the target memory cell being less than the sense voltage level Vsense. For example, when sense voltage level Vsense is the program verify voltage during the program verify operation, sense amplifier 155 detecting a current flow and/or sense amplifier 155 detecting the voltage level Vdchg may be indicative of the target memory cell not being programmed to a desired data state, e.g., the target memory cell failing the program verify operation. When sense voltage level Vsense is a read voltage, for example, sense amplifier 155 detecting a current flow and/or sense amplifier 155 detecting the voltage level Vdchg may be indicative of the target memory cell having a threshold voltage corresponding to (e.g., assigned to) a different particular data value and thus may be indicative of target memory cell storing that data value.

The single-bit-per-cell (e.g., the two-level) reads in the examples described above in conjunction the examples of FIGS. 1 and 5 and FIGS. 5 and 6, may result in an increase (e.g., of about 30 percent) in the rate at which data may be read compared to single-bit-per-cell reads for memory devices where data lines 110-1 and 110-2 are not selectively connected by transistor 150 or by transistors 650-1 and 650-2, but instead form a continuous data line.

The single-bit-per-cell (e.g., the two-level) programming in the examples described above in conjunction the examples of FIGS. 1 and 4 and FIGS. 6 and 7, may result in an increase (e.g., of about 60 percent) in the rate at which data may be programmed compared to single-bit-per-cell programming for memory devices where data lines 110-1 and 110-2 are not selectively connected by transistor 150 or by transistors 650-1 and 650-2, but instead form a continuous data line.

Figure 8:
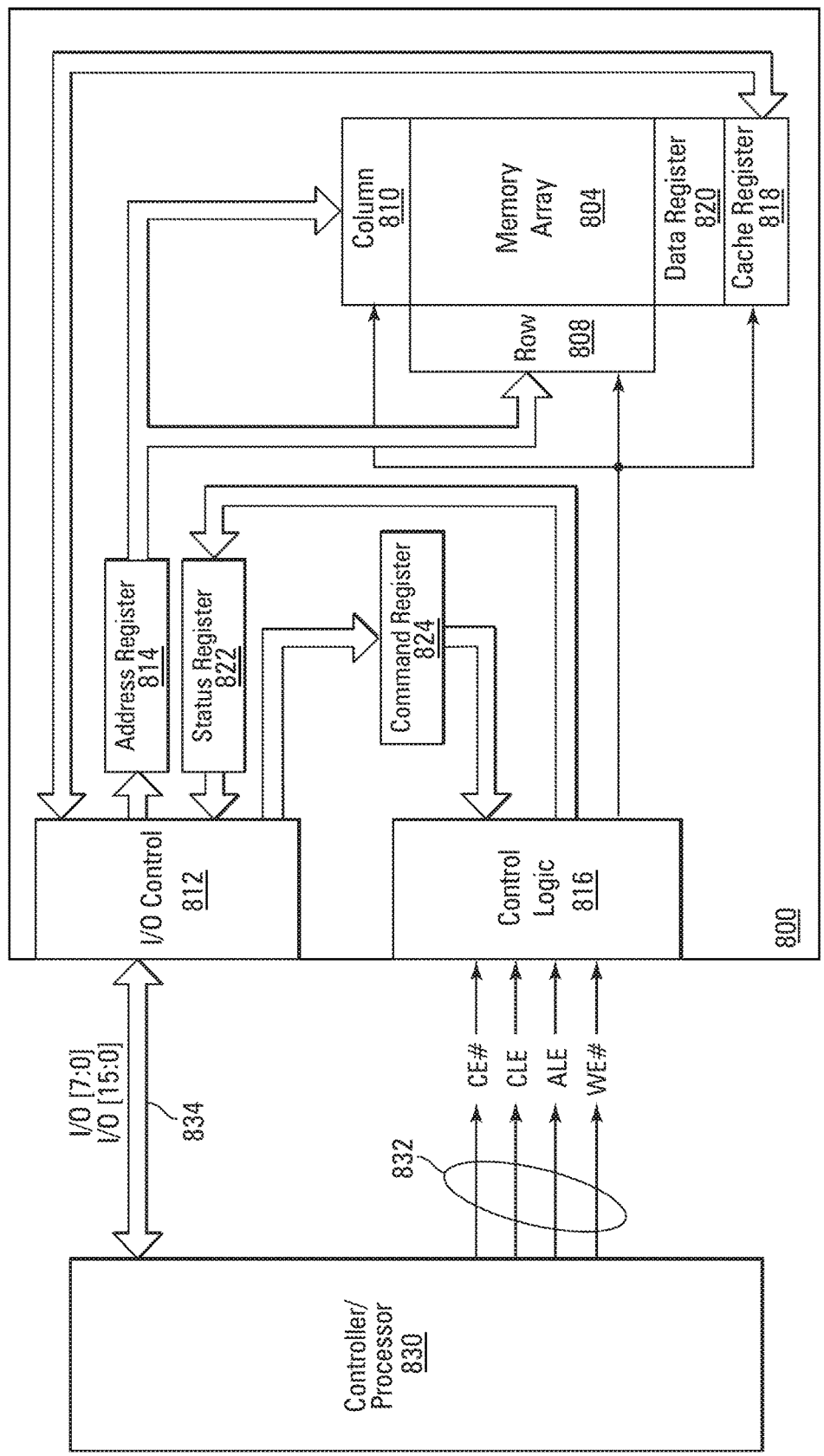
FIG. 8 is a simplified block diagram of an electronic system, according to an embodiment.

FIG. 8 is a simplified block diagram of an electronic device, e.g., an integrated circuit device, such as a memory device 800, in communication with a controller 830, such as a memory controller, e.g. a host controller, as part of an electronic system, according to an embodiment. Memory device 800 might be a NAND flash memory device, for example.

Controller 830 might include a processor, for example. Controller 830 might be coupled to a host, for example, and may receive command signals (or commands), address signals (or addresses), and data signals (or data) from the host and may output data to the host.

Memory device 800 includes an array of memory cells 804 that might include the array portions shown in the examples of FIG. 1, 2, 3, or 6. Memory array 804 may be what is often referred to as a two-dimensional array, where the memory cells might be in a single physical (e.g., vertical) plane, or a stacked memory array, e.g., what is often referred to as a three-dimensional memory array, where memory cells might be in different physical (e.g., vertical) planes. A row decoder 808 and a column decoder 810 might be provided to decode address signals. Address signals are received and decoded to access memory array 804.

In some examples, memory device 800, e.g., memory array 804, might include a first string of memory cells selectively connected to a first data line, a second string of memory cells selectively connected to a second data line, and a transistor that selectively connects the first data line to the second data line. In other examples, memory device 800, e.g., memory array 804, might include a first string of memory cells selectively connected to a first data line, a second string of memory cells selectively connected to a second data line, a first transistor connected in series with the first data line, and a second transistor connected in series with the second data line and the first transistor.

Memory device 800 might also include input/output (I/O) control circuitry 812 to manage input of commands, addresses, and data to the memory device 800 as well as the output of data and status information from the memory device 800. An address register 814 is in communication with I/O control circuitry 812, and row decoder 808 and column decoder 810, to latch the address signals prior to decoding. A command register 824 is in communication with I/O control circuitry 812 and control logic 816, to latch incoming commands. Control logic 816 controls access to the memory array 804 in response to the commands and generates status information for the external controller 830. The control logic 816 is in communication with row decoder 808 and column decoder 810 to control the row decoder 808 and column decoder 810 in response to the addresses.

Control logic 816 can be included in controller 830. Controller 830 can include, other circuitry, firmware, software, or the like, whether alone or in combination. Controller 830 can be an external controller (e.g., in a separate die from the memory array 804, whether wholly or in part) or an internal controller (e.g., included in a same die as the memory array 804). For example, an internal controller might be a state machine or a memory sequencer.

Controller 830, for example, might be configured to cause the memory device 800 to operate in a single-level mode of operation, e.g., where the memory cells in memory array 804 might be programmed and/or sensed as single-level memory cells, and/or to cause the memory device 800 to operate in a multilevel mode of operation, e.g., where the memory cells in memory array 804 might be programmed and/or sensed as multilevel memory cells. As such, for example, memory device 800 may be configured to operate in the single-level mode of operation and/or the multilevel mode of operation.

Controller 830 may be configured to cause memory device 800 to perform the methods disclosed herein. In some examples, controller 830 might be configured to cause the memory device 800 to perform a method of programming, including activating a transistor to connect first and second data lines in series, applying a first voltage to the first and second data lines while the transistor is activated, deactivating the transistor to maintain the first voltage on the first data line, applying a second voltage to the second data line while the transistor is deactivated, connecting the first data line to a first target memory cell while the first voltage is on the first data line, connecting the second data line to a second target memory cell while applying the second voltage to the second data line, and applying a program voltage to the first and second target memory cells.

In some examples, controller 830 might be configured to cause the memory device 800 perform a method of sensing, including applying a sense voltage to first and second target memory cells, activating a transistor to connect first and second data lines in series, connecting the first target memory cell to the first data line and to a first source and sensing the series-connected first and second data lines while the second memory cell is disconnected from the second data line, disconnecting the first target memory cell from the first data line, and connecting the second target memory cell to the second data line and to a second source and sensing the series-connected first and second data lines while the first memory cell is disconnected from the first data line.

In some examples, controller 830 might be configured to cause the memory device 800 to perform a method of programming, including activating a first transistor connected in series with a first data line, applying a first voltage to the first data line while the first transistor is activated, deactivating the first transistor to maintain the first voltage on the first data line, activating a second transistor connected in series with the first transistor and in series with a second data line, applying a second voltage to the second data line while the second transistor is activated, connecting the first data line to a first target memory cell while the first voltage is on the first data line, connecting the second data line to a second target memory cell while applying the second voltage to the second data line, and applying a program voltage to the first and second target memory cells.

In some examples, controller 830 might be configured to cause the memory device 800 perform a method of sensing, including applying a sense voltage to first and second target memory cells, activating first and second transistors that are connected in series between first and second data lines, connecting the first target memory cell to the first data line and to a first source and sensing a node between the first and second transistors while the second memory cell is disconnected from the second data line, disconnecting the first target memory cell from the first data line, and connecting the second target memory cell to the second data line and to a second source and sensing the node while the first memory cell is disconnected from the first data line.

Control logic 816 is also in communication with a cache register 818 that might include data latches, such as data latch 160. Cache register 818 latches data, either incoming or outgoing, as directed by control logic 816 to temporarily store data while the memory array 804 is busy writing or reading, respectively, other data. During a write operation, data is passed from the cache register 818 to data register 820, e.g., that might include a page buffer, such as the page buffers 158-1 and 158-2, and a sense amplifier, such as sense amplifier 155, for transfer to the memory array 804; then new data is latched in the cache register 818 from the I/O control circuitry 812. During a read operation, data is passed from the cache register 818 to the I/O control circuitry 812 for output to controller 830 and subsequent output to a host; then new data is passed from the data register 820 to the cache register 818. A status register 822 is in communication with I/O control circuitry 812 and control logic 816 to latch the status information for output to the controller 830.

Memory device 800 receives control signals at control logic 816 from controller 830 over a control link 832. The control signals may include at least a chip enable CE#, a command latch enable CLE, an address latch enable ALE, and a write enable WE#. Memory device 800 receives command signals (which represent commands), address signals (which represent addresses), and data signals (which represent data) from controller 830 over a multiplexed input/output (I/O) bus 834 and outputs data to controller 830 over I/O bus 834.

For example, the commands are received over input/output (I/O) pins [7:0] of I/O bus 834 at I/O control circuitry 812 and are written into command register 824. The addresses are received over input/output (1/O) pins [7:0] of bus 834 at I/O control circuitry 812 and are written into address register 814. The data are received over input/output (I/O) pins [7:0] for an 8-bit device or input/output (I/O) pins [15:0] for a 16-bit device at I/O control circuitry 812 and are written into cache register 818. The data are subsequently written into data register 820 for programming memory array 804. For another embodiment, cache register 818 may be omitted, and the data are written directly into data register 820. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device 800 of FIG. 8 has been simplified. It should be recognized that the functionality of the various block components described with reference to FIG. 8 may not necessarily be segregated to distinct components or component portions of an integrated circuit device. For example, a single component or component portion of an integrated circuit device could be adapted to perform the functionality of more than one block component of FIG. 8. Alternatively, one or more components or component portions of an integrated circuit device could be combined to perform the functionality of a single block component of FIG. 8.

Additionally, while specific I/O pins are described in accordance with popular conventions for receipt and output of the various signals, it is noted that other combinations or numbers of I/O pins may be used in the various embodiments.

CONCLUSION

Although specific examples have been illustrated and described herein, it will be appreciated by those of ordinary skill in the art that any arrangement that is calculated to achieve the same purpose may be substituted for the specific examples shown. Many adaptations of the examples will be apparent to those of ordinary skill in the art. Accordingly, this application is intended to cover any adaptations or variations of the examples.

What is claimed is:

1. A method of programming a memory device, comprising:
   activating a transistor to connect first and second data lines in series;
   applying a first voltage to the first and second data lines while the transistor is activated;
   deactivating the transistor to maintain the first voltage on the first data line;
   applying a second voltage to the second data line while the transistor is deactivated;
   connecting the first data line to a first target memory cell while the first voltage is on the first data line;
   connecting the second data line to a second target memory cell while the second voltage is on the second data line; and
   applying a program voltage to the first and second target memory cells.

2. The method of claim 1, wherein connecting the first data line to the first target memory cell comprises activating a first select transistor that is between the first target memory cell and the first data line and wherein connecting the second data line to the second target memory cell comprises activating a second select transistor that is between the second target memory cell and the second data line.

3. The method of claim 1, further comprising applying a pass voltage to untargeted first memory cells that are connected in series with the first target memory cell and to untargeted second memory cells that are connected in series with the second target memory cell while applying the program voltage to the first and second target memory cells.

4. The method of claim 1, wherein applying the first voltage to the first and second data lines comprises a first page buffer connected in series with the second data line applying the first voltage to the first and second data lines, wherein applying the second voltage to the second data line comprises a second page buffer connected in series with the second data line applying the second voltage to the second data line.

5. The method of claim 1, wherein the first voltage is an inhibit voltage and the second voltage allows the second target memory cell to program.

6. A method of sensing in a memory device, the method comprising:
   applying a sense voltage to first and second target memory cells;
   activating a transistor to connect first and second data lines in series;
   connecting the first target memory cell to the first data line and to a first source and sensing the series-connected first and second data lines while the second target memory cell is disconnected from the second data line;
   disconnecting the first target memory cell from the first data line; and
   connecting the second target memory cell to the second data line and to a second source and sensing the series-connected first and second data lines while the first memory cell is disconnected from the first data line.

7. The method of claim 6, further comprising applying a pass voltage to memory cells connected in series with the first and second target memory cells concurrently with applying the sense voltage to the first and second target memory cells.

8. The method of claim 7, wherein connecting the first target memory cell to the first data line and to the first source comprises respectively activating a first select transistor between the first target memory cell and the first data line and a second select transistor between the first target memory cell and the first source, and wherein connecting the second target memory cell to the second data line and to the second source comprises respectively activating a third select transistor between the second target memory cell and the second data line and a fourth select transistor between the second target memory cell and the second source.

9. The method of claim 8, wherein activating the first select transistor between the first target memory cell and the first data line and the second select transistor between the first target memory cell and the first source is in response to an address that addresses the first target memory cell, wherein activating the third select transistor between the second target memory cell and the second data line and the fourth select transistor between the second target memory cell and the second source is in response to an address that addresses the second target memory cell.

10. The method of claim 6, wherein sensing the series-connected first and second data lines comprises sensing the series-connected first and second data lines with a sense amplifier connected in series with the second data line.

11. The method of claim 6, wherein applying the sense voltage to the first and second target memory cells comprises applying a read voltage to the first and second target memory cells.

12. The method of claim 6, further comprising storing a data value in a first page buffer connected in series with the second data line in response to sensing the series-connected first and second data lines while the second memory cell is disconnected from the second data line and storing a data value in a second page buffer connected in series with the second data line in response to sensing the series-connected first and second data lines while the first memory cell is disconnected from the first data line.

13. The method of claim 6, wherein applying the sense voltage to the first and second target memory cells comprises applying a program verify voltage to the first and second target memory cells.

14. The method of claim 6, further comprising applying a voltage to the first and second data lines while the transistor is activated and before connecting the first target memory cell to the first data line and to the first source.

15. A method of programming a memory device, comprising:
    activating a first transistor connected in series with a first data line;
    applying a first voltage to the first data line while the first transistor is activated;
    deactivating the first transistor to maintain the first voltage on the first data line;
    activating a second transistor connected in series with the first transistor and in series with a second data line;
    applying a second voltage to the second data line while the second transistor is activated;
    connecting the first data line to a first target memory cell while the first voltage is on the first data line;
    connecting the second data line to a second target memory cell while the second voltage is on the second data line; and
    applying a program voltage to the first and second target memory cells.

16. The method of claim 15, wherein applying the first voltage to the first data line while the first transistor is activated comprises a first page buffer connected to a node between the first and second transistors applying the first voltage to the first data line while the first transistor is activated, and wherein applying a second voltage to the second data line while the second transistor is activated comprises a second page buffer connected to the node between the first and second transistors applying the second voltage to the second data line while the second transistor is activated.

17. The method of claim 15, wherein connecting the first data line to the first target memory cell comprises activating a first select transistor that is between the first target memory cell and the first data line and wherein connecting the second data line to the second target memory cell comprises activating a second select transistor that is between the second target memory cell and the second data line.

18. The method of claim 15, further comprising applying a pass voltage to untargeted first memory cells that are connected in series with the first target memory cell and to untargeted second memory cells that are connected in series with the second target memory cell while applying the program voltage to the first and second target memory cells.

19. A method of sensing in a memory device, the method comprising:
    applying a sense voltage to first and second target memory cells;
    activating first and second transistors that are connected in series between first and second data lines;
    connecting the first target memory cell to the first data line and to a first source and sensing a node between the first and second transistors while the second target memory cell is disconnected from the second data line;
    disconnecting the first target memory cell from the first data line; and
    connecting the second target memory cell to the second data line and to a second source and sensing the node while the first memory cell is disconnected from the first data line.

20. The method of claim 19, further comprising applying a pass voltage to memory cells connected in series with the first and second target memory cells concurrently with applying the sense voltage to the first and second target memory cells.

21. The method of claim 19, wherein applying the sense voltage to the first and second target memory cells comprises applying a program verify voltage or a read voltage to the first and second target memory cells.

* * * * *